United States Patent
Kimoto

(10) Patent No.: US 7,501,840 B2
(45) Date of Patent: Mar. 10, 2009

(54) PROBE ASSEMBLY COMPRISING A PARALLELOGRAM LINK VERTICAL PROBE MADE OF A METAL FOIL ATTACHED TO THE SURFACE OF A RESIN FILM

(76) Inventor: Gunsei Kimoto, 1-3-2-807, Daiba, Minato-ku, Tokyo (JP)

( * ) Notice: Subject to any disclaimer, the term of this patent is extended or adjusted under 35 U.S.C. 154(b) by 0 days.

(21) Appl. No.: 11/706,652

(22) Filed: Feb. 15, 2007

(65) Prior Publication Data
US 2007/0200578 A1    Aug. 30, 2007

(30) Foreign Application Priority Data

| Feb. 19, 2006 | (JP) | ............................ 2006-073505 |
| Feb. 22, 2006 | (JP) | ............................ 2006-081729 |
| Apr. 6, 2006 | (JP) | ............................ 2006-129585 |

(51) Int. Cl.
*G01R 31/02* (2006.01)
(52) U.S. Cl. ...................... 324/754; 324/762
(58) Field of Classification Search ............ None
See application file for complete search history.

(56) References Cited

U.S. PATENT DOCUMENTS

| 3,611,128 | A | * | 10/1971 | Nagata ........................ 324/72.5 |
| 4,116,523 | A | * | 9/1978 | Coberly et al. ............... 439/578 |
| 5,599,194 | A | * | 2/1997 | Ozawa et al. ................. 439/72 |
| 6,034,534 | A | * | 3/2000 | Kiyota ........................ 324/762 |
| 6,184,699 | B1 | * | 2/2001 | Smith et al. .................. 324/762 |
| 6,271,674 | B1 | * | 8/2001 | Hasegawa et al. ........... 324/754 |
| 6,326,688 | B1 | | 12/2001 | Ochiai |
| 6,330,744 | B1 | | 12/2001 | Doherty et al. |
| 6,489,795 | B1 | * | 12/2002 | Klele et al. .................. 324/762 |
| 6,657,448 | B2 | | 12/2003 | Hasegawa |
| 6,731,123 | B2 | * | 5/2004 | Kimoto ....................... 324/754 |
| 7,423,441 | B2 | * | 9/2008 | Kimoto ....................... 324/762 |
| 7,432,727 | B2 | * | 10/2008 | Kimoto ....................... 324/754 |
| 7,443,182 | B2 | * | 10/2008 | Kimoto ....................... 324/754 |
| 2003/0067315 | A1 | | 4/2003 | Kimoto |
| 2005/0253607 | A1 | * | 11/2005 | Kimoto ....................... 324/754 |
| 2007/0063718 | A1 | * | 3/2007 | Kimoto ....................... 324/754 |
| 2007/0200578 | A1 | | 8/2007 | Kimoto |
| 2007/0216433 | A1 | * | 9/2007 | Miura et al. ................. 324/762 |

FOREIGN PATENT DOCUMENTS

EP        0802419 A2    10/1997

OTHER PUBLICATIONS

Faure, "Modular Probe," IBM Technical Disclosure Bulletin, Nov. 1974, vol. 17, No. 6, p. 1634.
European Search Report issued Mar. 29, 2007, 5 pgs., in Application No. EP 05 25 5613.

(Continued)

*Primary Examiner*—Paresh Patel
(74) *Attorney, Agent, or Firm*—Haynes and Boone, LLP

(57) ABSTRACT

A probe assembly for performing circuit inspection of semiconductor chips according to which a resin film with copper foil attached thereto is used to form a conductive portion including a vertical probe on the resin film by etching the copper foil, plural sheets of the resin film with the vertical probe are laminated, and end portions of the vertical probes are brought into contact with electrode pads of the chips.

31 Claims, 24 Drawing Sheets

OTHER PUBLICATIONS

Richard Isla-Rodas, "Notice of Allowance and Fee(s) Due," mailed on May 6, 2008, 10 pgs. in U.S. Appl. No. 11/080,601.
Richard Isla-Rodas, "Notice of Allowance and Fee(s) Due," mailed on Dec. 28, 2007, 9 pgs., in U.S. Appl. No. 11/080,601.
Richard Isla-Rodas, "Notice of Allowance and Fee(s) Due," mailed on Oct. 18, 2007, 9 pgs., in U.S. Appl. No. 11/080,601.
Richard Isla-Rodas, "Office Action," mailed on Jul. 11, 2007, 9 pgs., in U.S. Appl. No. 11/080,601.
Richard Isla-Rodas, "Office Action," mailed on Dec. 28, 2006, 10 pgs., in U.S. Appl. No. 11/080,601.
Richard Isla-Rodas, "Office Action," mailed on Sep. 28, 2006, 6 pgs., in U.S. Appl. No. 11/080,601.

* cited by examiner

FIG. 23
(a)
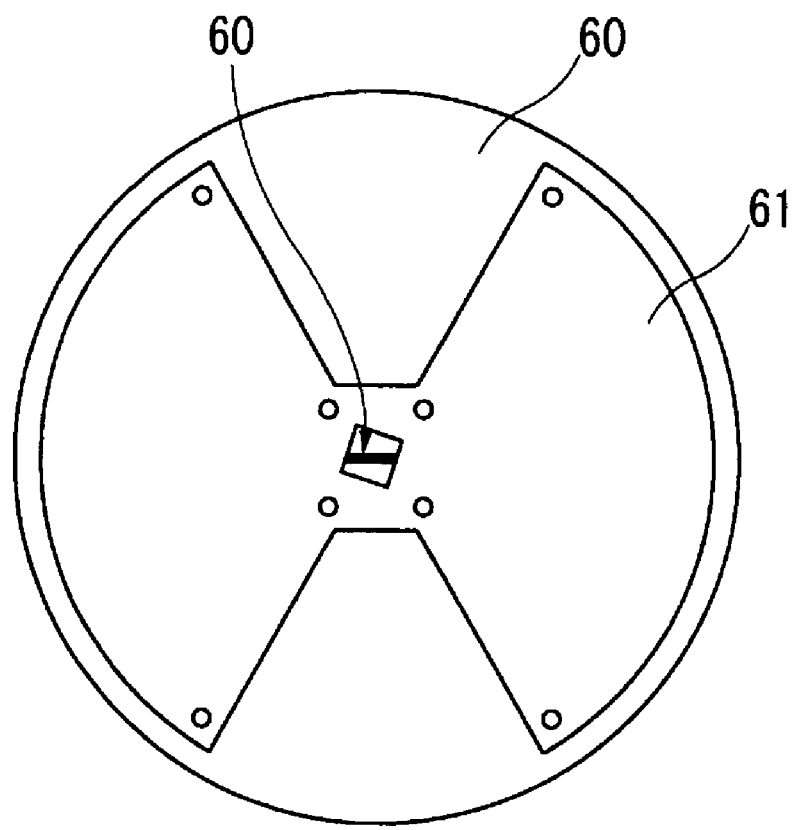
(b)
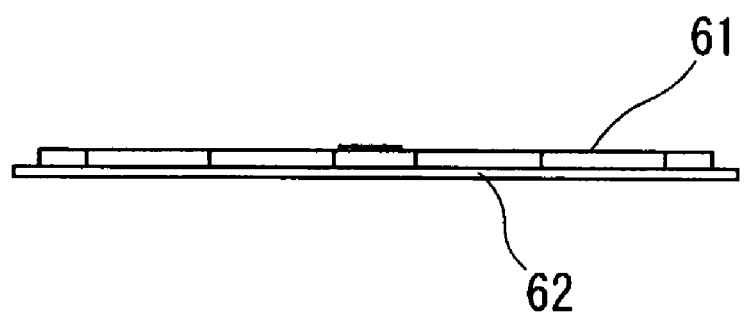

PROBE ASSEMBLY COMPRISING A PARALLELOGRAM LINK VERTICAL PROBE MADE OF A METAL FOIL ATTACHED TO THE SURFACE OF A RESIN FILM

CROSS REFERENCE TO RELATED APPLICATIONS

This application claims priority to Japanese patent application number 2006-073505, filed Feb. 19, 2006; Japanese patent application number 2006-081729, filed Feb. 22, 2006; and Japanese patent application number 2006-129585, filed Apr. 6, 2006, the disclosures of which are incorporated herein by reference.

BACKGROUND OF THE PRESENT INVENTION

1. Field of the Present Invention

The present invention relates to a probe assembly of a prober device used for circuit inspection of plural semiconductor chips formed on a wafer in a production process of an electronic device such as LSI. More particularly, the present invention relates to a probe assembly of a prober device used for probing test that collectively measures electrical continuity of semiconductor chips by vertical probes brought into contact with circuit terminals (pads) arranged on the semiconductor chips in a wafer state.

2. Description of Prior Art

Along with the development of semiconductor technology, the integration degree of electronic devices is increasing. An area occupied by the circuit wiring is increasing in each semiconductor chip formed on a wafer and the number of circuit terminals (pads) on each semiconductor chip is also increasing. Under such circumstances, miniaturization of pad arrangement is pursued by reducing the pad area and narrowing the pad pitch, and the like. At the same time, a chip size package (CSP) is increasingly used where semiconductor chips are mounted as bear chips on a circuit board or other substrate, without being placed in a package. For this reason it is inevitably necessary to check characteristics and determine quality in the wafer state before dividing into semiconductor chips.

Particularly an issue arising out of the miniaturization of pad arrangement (narrowing of pitch) is that the probe structure is made suitable for the miniaturization of pad arrangement to obtain electrical continuity by bringing into contact with the pads of the semiconductor chips in the electrical characteristics test and circuit inspection of electronic devices. In order to address the increasingly miniaturized pad arrangement, various types of measurement methods are used.

For example, there is a method in which plural needle probes each having an elastically deformed portion that elastically deforms under an external force are arranged in area array to form a probe assembly, and then the probe assembly is interposed between pads of semiconductor chips to be inspected and an inspection apparatus. A printed wiring board called a probe card is used as means for electrically connecting the probe assembly and the inspection circuit of the semiconductor chips.

Generally in the case where a needle probe with a cantilever structure is used in a probe card, an end portion of the probe to contact a pad of semiconductor chip has a narrowed pitch. On the other hand, a root portion thereof connecting the probe card can have a rough pitch because the probe is arranged extending radially from the end portion. With such a configuration, it has been possible to fix the probe to a circuit terminal of the probe card by a connection method such as soldering. However, this cantilever structure has had the following problems. The pad is damaged as the end is displaced in horizontal direction when contacting the pad, and the measurement yield decreases as the end deviates from the pad. In addition, only one chip can be measured at a time, and it is difficult to control the contact pressure to be constant due to variation of the fitting accuracy of each probe.

In a vertical probe replacing the cantilever structure, more specifically, in a probe vertically fixed to a circuit terminal of a probe card, it is necessary to configure that the pad pitch on the semiconductor chip and the circuit terminal pitch on the probe card have the same pitch interval. However, there is technical limitation to miniaturize the circuit pattern on the probe card which is a printed wiring board. Thus it is difficult to meet the requirement of matching the pad pitch in relation to the area occupied by the circuit terminals and to the wiring width. The pitch interval available for soldering is also limited, so that it has not been possible to vertically fix the vertical probes to the probe card in line with the pad pitch of the semiconductor chip as the miniaturization has progressed.

As described above, on the probe card, a large proportion of planar area is occupied by the circuit wiring width in addition to the circuit terminal area, preventing the pitch of the circuit terminals from being narrowed. For this reason, there is also employed a method of ensuring the number of vertical probes in such a way that a multilayer printed wiring board is used as the probe card on which circuit terminals are arranged in a grid fashion or in two zigzag rows and that wiring is electrically connected between layers via through holes. However, the through holes occupy a large space, so that the presence of the through holes is a factor that prevents the pitch from being narrowed in the circuit terminal arrangement. Consequently, in vertically fixing a probe to a circuit terminal of a probe card, advanced techniques and a large number of working man-hours are required for soldering operation, in addition to the difficulty in narrowing the pitch of the circuit terminal, and thus making the cost expensive. In order to solve such problems, the present inventors have proposed a vertical probe assembly (see JP-A No. 274010/2004) and also have already proposed a prober device using the same (see JP-A No. 300545/2005)

The vertical probe assembly proposed by the inventors as the prior art, as shown in FIG. 22 of JP-A No. 274010/2004 and in FIG. 4 of JP-A No. 300545/2005, is formed by attaching a copper thin plate to a surface of a ribbon-like (strip-like) resin film, forming a vertical copper probe having a curved portion on the resin film surface by etching the copper thin plate, and laminating plural sheets of the resin film to which the probe is fixed.

As the vertical probe assembly has a structure of laminating resin films, plural probes can be arranged in a very small area. The resin film has an opening thinly extending in longitudinal direction. The probe has a vertical portion provided separating by a predetermined distance in vertical relation with a terminal at an end thereof, in which an elastically deformed portion is formed in such a way that a middle of the vertical portion is curved along the periphery of the opening in intersecting direction to the vertical portion. In this way it is designed to absorb distortion due to pressure generated when the probe end contacts the pad, by the opening of the resin film and the elastically deformed portion of the probe.

As described above, in order to disperse the pressure applied to the probe and the resin film during measurement operation, the inventors propose various forms by modifying and adjusting the size and shape of the opening of the resin film as well as the curved shape of the probe. However, although the probe assembly adapted to the narrowing of pitch can be provided with complicated process of forming resin films and probes, this would increase the production cost. The present invention provides a vertical probe assembly by use of a simple structure similar to the cantilever structure for the shape of the probe to facilitate the process of forming the opening of the resin film and the like, with less man-hour for working.

Further, it makes possible to realize a contact assembly of a grid arrangement of a small arrangement pitch by providing contacts each having an elastically deformed portion whose shape can be selected from many different types to freely determine the relative position relationship between an input portion and an output portion, and by arranging the contacts at a predetermined angle to the x axis.

In a probe assembly for performing circuit inspection of semiconductor chips, a resin film with copper foil attached thereto is used to form a conductive portion including a vertical probe on the resin film by applying etching process to the copper foil, and plural sheets of the resin film with the vertical probe are laminated, and then end portions of the vertical probes are brought into contact with electrode pads of the semiconductor chips at a time. The conductive portion including the vertical probe forms a parallelogram link having parallel springs.

As described above, the prober device using the film-laminated type vertical probe assembly that the inverters have already proposed is a device capable of measuring for semiconductor chips of a narrowed pad pitch, for example, of 45 µm or less (e.g., 20 µm pitch). In addition, mass production can be achieved at low cost as the probe can be automatically assembled without the use of fixing means such as soldering or resin. Another important advantage is that the contact pressure can be controlled uniformly for all probes that can vertically contact the chip pads at a time.

Taking advantage of theses advantages, the present invention provides a vertical probe assembly that uses a simple structure substantially similar to the cantilever structure as the shape of the probe formed in the resin film to facilitate the process of forming the opening of the resin film and the like, with less man-hour for working.

According to the present invention, a probe assembly is provided to perform circuit inspection of semiconductor chips, in which a resin film with copper foil attached thereto is used to form a conductive portion including a vertical probe on the resin film by applying etching process to the copper foil, and plural sheets of the resin film with the vertical probe are laminated, and then end portions of the vertical probes are brought into contact with electrode pads of the semiconductor chips at a time. The conductive portion including the vertical probe forms a parallelogram link having parallel springs. In the present invention, plural probes are arranged in one resin film and plural sheets of the resin film are laminated.

Further, according to the present invention, a parallelogram link mechanism having the parallel spring structure is a cantilever structure that has the vertical probe on one end side and extends in horizontal direction from the other end side as a fixed support portion. As a variation of the present invention, the parallel springs are a link mechanism that is curved and deformed in bending direction. Incidentally, as aspect of the present invention, an opening may be or may not be provided in a resin film portion corresponding to an inner space of the parallel springs.

Further, according to the present invention, there is provided a terminal portion connected to the vertical probe through the link mechanism and the conductive portion while contacting a connection pad of a circuit board of an inspection apparatus. The terminal portions are formed in the resin films so as to be arranged at positions displaced by the same pitch when the resin films with probe are laminated. Further, a curved portion is provided in the conductive portion in the vicinity of the terminal portion. As aspect of the present invention, a cut portion is provided in the vicinity between the link mechanism and the terminal portion to form the cantilever structure. As another aspect of the present invention, a dummy portion is formed by leaving a predetermined portion in addition to the conductive portion without removing the copper foil when it is etched, and by electrically separating from the conductive portion. The dummy portion serves as a reinforcing member of the resin film. Further, as still another aspect of the present invention, an insulation adhesive is filled in the resin film surface between the conductive portion and the dummy portion.

With the above described different features, the present invention has various advantages that will be described below.

In the probe assembly according to the present invention, the parallel spring structure is used as the structure of the vertical probe in the resin film with probe. Thus it is possible to reduce the move distance (displacement) of the end of the cantilever needle in the horizontal direction, compared to the move distance in the vertical direction that has been a problem in the past. This means that the probe of the cantilever structure can be used even if the pad area of semiconductor chip is miniaturized. Up to now, it has been necessary to make the vertical probe thinner as the pitch narrows down, which has limited the elastic strength of the curved portion. However, the vertical probe according to the present invention can achieve sufficient elastic strength by the cantilever structure using the parallel springs without having the curved portion. In addition, there is no need to use a complex structure such as the curved portion, so that the etching process of the copper foil is facilitated and thus the production cost can be reduced.

The contact assembly according to the present invention shows the link structure in which the shape of the parallel springs constituting the cantilever is previously deformed. In this case also, the move distance of the end portion of the vertical probe can be reduced. It is designed that the move distance has a relationship proportional to a tilt angle θ, so that the move distance can be selected without change of the deformation amount of the parallel springs when the shape is previously deformed. In other words, this structure allows the amount of friction to be determined according to the user specifications.

In the present invention, preferably the surface of the vertical probe and the surface of a positioning dummy portion are in the same plane. Further preferably a large force is not applied to the positioning dummy portion even when probing operation is performed in the z direction of the vertical probe. This is because each probe is needed to operate independently. A coupling dummy portion is formed on the tape to reduce bending in the y direction.

A first object of the present invention is to provide a vertical probe assembly formed by forming a probe of cantilever structure in a resin film to facilitate the process of forming an opening of the resin film and the like, with less man-hour for working.

A second object of the present invention is to provide a vertical probe assembly having advantages that mass production can be achieved at low cost, and that the contact pressure can be controlled uniformly for all probes that can vertically contact the chip pads at a time.

A third object of the present invention is to provide a vertical probe assembly having a dummy portion formed by leaving a predetermined portion in addition to the conductive portion without removing the copper foil when it is etched, and by electrically separating from the conductive portion in order to reinforce the resin film.

A fourth object of the present invention is to provide a vertical probe assembly in which the insulation properties between the conductive portion and the dummy portion are improved.

The foregoing objects and advantages of the present invention will be further apparent from the following description with reference to the accompanying drawings.

BRIEF DESCRIPTION OF THE DRAWINGS

FIGS. 23A and 23B are views showing the configuration of the probe assembly retention mechanism shown in FIG. 22, in which FIG. 23A is a top view and FIG. 23B is a side view; and FIGS. 24A to 24C are views in the probe assembly retention mechanism shown in FIG. 22 and in FIGS. 23A and 23B, in which FIG. 24A is an exploded perspective view showing partially broken away of the arrangement relationship between the probe assembly and the probe assembly retention mechanism, FIG. 24B is an enlarged perspective view showing the contact portions between the terminals of the probe end portions and the corresponding pads of the chip, and FIG. 24C is an enlarged perspective view showing the probe base end portions extended in a circular arc shape.

DESCRIPTION OF THE PREFERRED EMBODIMENTS

Figure 1:
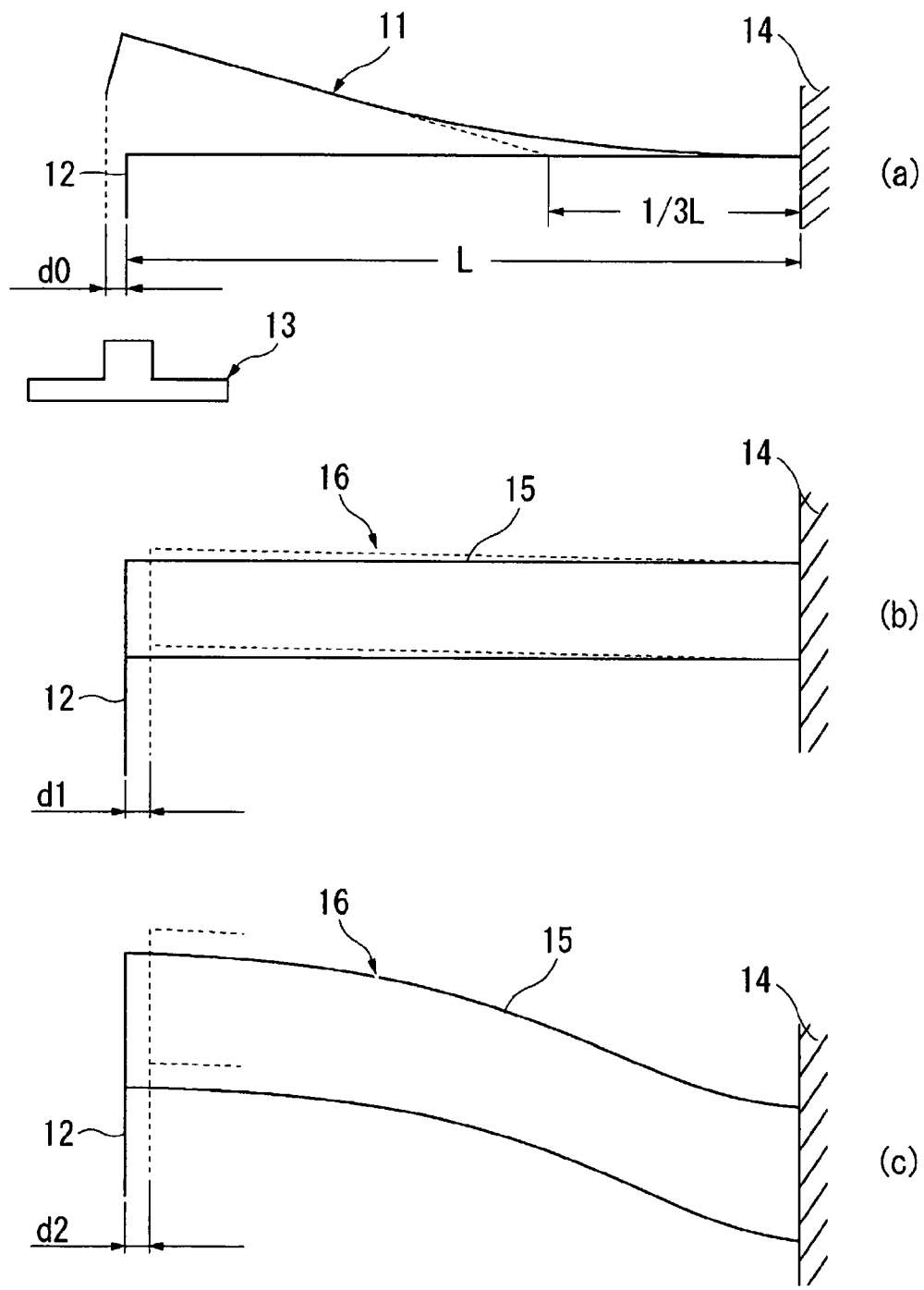
FIGS. 1A to 1C are illustrative views showing the movement of a vertical probe according to the present invention.

Hereinafter preferred embodiments of the present invention will be described with reference to accompanying drawings. FIGS. 1A, 1B, 1C are principle views each showing the movement of an end portion of a vertical probe. In the figures, reference numeral 11 denotes a cantilever for supporting a vertical probe, the structure of which has been used as the support structure for vertical probes. Reference numeral 12 denotes a vertical probe, 13 denotes a pad portion of a device to be inspected such as a wafer or a semiconductor chip, 14 denotes a support portion for supporting the cantilever 11 and a link (described below) 16, 15 denotes parallel springs proposed by the present invention as a member for supporting the vertical probe 12, and 16 denotes the parallelogram link formed by the parallel springs 15. The end portion of the vertical probe 12 remains vertical until contacting the pad portion 13.

In FIG. 1A, the vertical probe 12 attached to an end of the cantilever 11 of length L has an end portion vertically facing an upper surface of the pad portion 13 and the other end horizontally attached to the support portion 14. Next when the pad portion 13 is raised or the support portion 14 is lowered for inspection purpose, the end portion of the vertical probe 12 and the upper surface of the pad portion 13 come into contact with each other, and the cantilever 11 of length L is rotated at the calculated position of about (⅓) L. In other words, the cantilever 11 is bended and deformed. At this time, the end portion of the vertical probe 12 largely moves by a distance $d_0$ in longitudinal direction relative to the upper surface of the pad portion 13 while keeping contact with the upper surface of the pad portion 13. As a result, the end portion of the vertical probe 12 may be deviated from the pad portion 13, or the upper surface of the pad portion 13 may be scratched and damaged.

In order to eliminate such negative effects, the present invention proposes the vertical probe 12, as shown in FIG. 1B, that has the parallelogram link 16 formed by the parallel springs 15 for the structural portion of the cantilever 11, and has a contact portion in one end of the link 16. With such a link structure, when a contact load is applied to the vertical probe 12 in the same vertical direction as shown in FIG. 1A, the relative move distance d1 of the end portion of the vertical probe 12 in the longitudinal direction is expressed as follows:

$$D_1 < d_0$$

where the move distance can be limited to a very small amount due to the link 16 structure formed by the parallel springs 15.

FIG. 1C shows the link 16 structure in which the shape of the parallel springs 15 constituting the cantilever 11 is previously deformed. The relative move distance $d_2$ of the end portion of the vertical probe 12 in the longitudinal direction is expressed as follows:

$$d_2 < d_0$$

where the move distance can be also limited to a very small amount.

Figure 2:
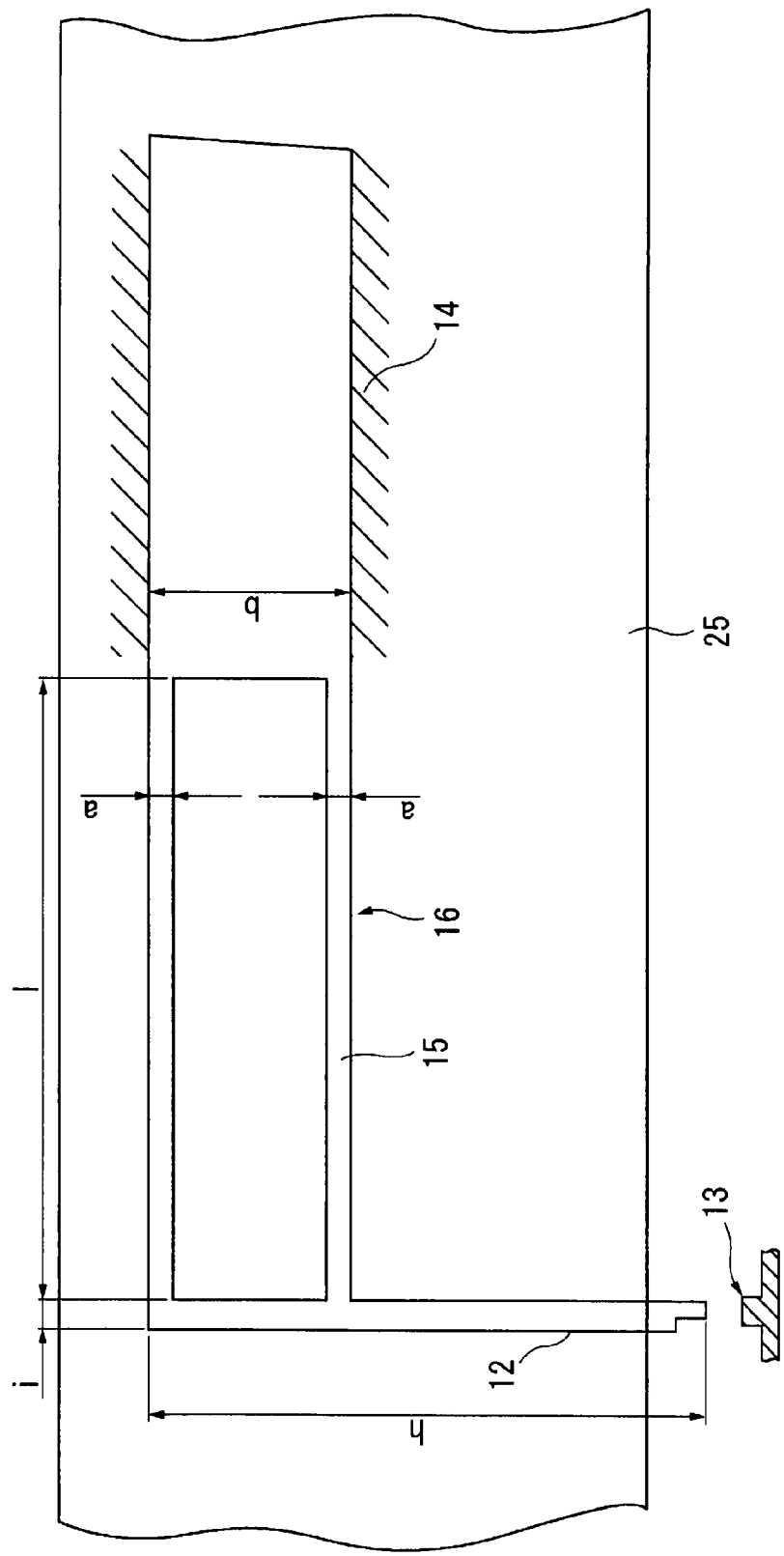
FIG. 2 is a top view showing a first embodiment of the vertical probe according to the present invention.

Next, referring to the top view of FIG. 2, a description will be made about a first embodiment of a resin film with the vertical probe 12 according to the present invention, to which the principles described in FIGS. 1B and 1C are applied (hereinafter simply referred to as a film with probe). In FIG. 2, reference numeral 25 denotes a resin film having a ribbon-like shape extending in the longitudinal direction (the left right direction in FIG. 2). The resin film 25 supports covering substantially the entire vertical probe 12 and link 16 formed by the parallel springs 15. Generally, plural combinations of the vertical probes 12 and the links 16 are arranged in the longitudinal direction of the resin film 25. The support portion 14 of the link 16 is formed by a part of the resin film. As shown in FIG. 2, the probe of the parallel spring structure is formed in a resin film surface by use of a beryllium copper thin plate of 20 μm in thickness and by applying etching process to the copper thin plate attached to a polyimide resin film of 5 μm in thickness.

The film with probe is formed by the vertical probe 12, the parallel springs 15 for holding the vertical probe 12 on one end side thereof, and the support portion 14 for supporting the parallel springs 15 on the other end side, in which only the end portion of the vertical probe 12 slightly protrudes outside of the resin film 25. The size of the parallel springs 15 is defined such that, for example as shown in FIG. 2, one spring width a is 20 μm and the entire width of the link 16 is in a range of 0.4 to 1 mm. Generally, the resin film 25 has an opening provided in a portion corresponding to an inner space of the parallel springs 15, in order to reduce the elastic coefficient of the parallel springs 15. However, when the width between the parallel springs 15 is narrow as the above described example, it is also possible to take a structure for reinforcing the parallel springs 15 by processing only the copper thin plate without providing the resin film with the opening between the parallel springs 15 so that the resin film has deformation resistance by itself.

Figure 3:
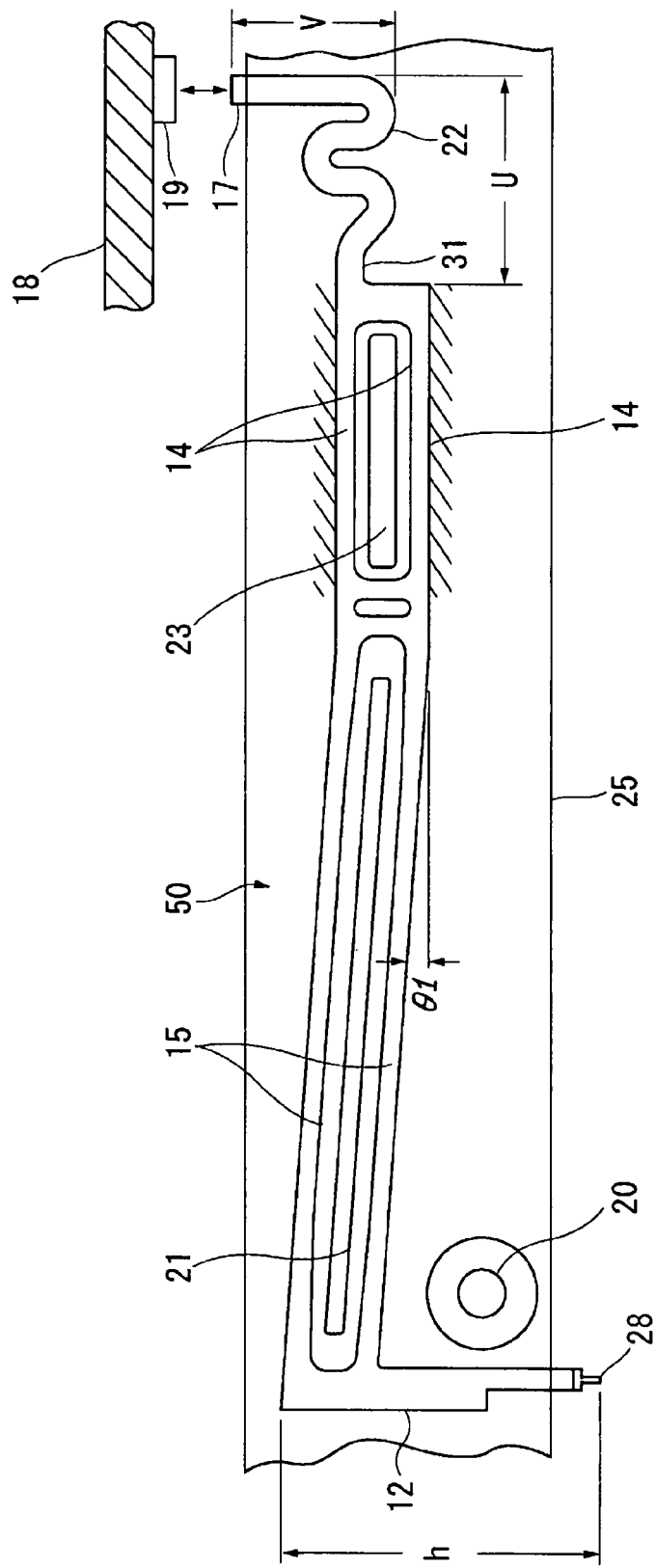
FIG. 3 is a top view showing a second embodiment of the vertical probe according to the present invention.

FIG. 3 is a top view showing a second embodiment of the film with probe. In the figure, reference numeral 25 denotes the resin film. The resin film 25 has a ribbon shape of a size that the entire probe structure can be placed, except for the end portion of the vertical probe 12. The parallel springs 15 have the vertical probe 12 on one end side thereof and the support portion 14 on the other end side. The parallel springs 15 are tilted at an angle θ 1 relative to the horizontal direction to form a resin-probe complex tape 50 of link structure. This is a variation of the structure of the case shown in FIG. 1C.

There is formed a conductive wiring 31 from the support portion 14 to further the base end side. The conductive wiring 31 reaches a terminal portion 17 extending in the vertical direction through a curved portion 22. On the opposite side of the vertical probe 12, a portion from the conductive wiring 31 to the terminal portion 17 provides contact with the inspection apparatus to send and receive signals. The terminal portion 17 is formed to serve as an electrical connection portion to the vertical probe 12 through the curved portion 22 by contacting the connection pad 19 of a circuit board 18 on the inspection apparatus side. Further the resin film 25 has a hole 20 through which a support rod passes. When plural sheets of the resin film 25 with probe are laminated, the support rod is inserted into the laminated resin films through the holes 20 as positioning and fixing portions. A probe assembly (also referred to as a contact assembly) is formed by laminating plural sheets of the resin film 25 with the vertical probe 12. A feature of this embodiment is that the copper foil is left as a dummy portion 21 in a portion corresponding to the opening portion of the resin film 25 between the parallel springs 15, instead the opening is provided. The dummy 21 serves as a reinforcing board to increase the deformation resistance of the resin film 25 and the parallel springs 15. In the following description, the combination of the vertical probe 12, parallel springs 15, terminal portion 17, and curved portion 22 will be collectively referred to as a conductive probe.

Similarly, parallel springs 24 having a function as a conductive portion are provided in the support portion 14 in which a dummy portion 23 is also provided in a portion between the parallel springs 24 to serve as a reinforcing board. By providing the parallel springs 24 in the support portion 14, not only the curved portion 22 but also the terminal portion 17 is elastically deformed upon electrical connection with the connection pad 19 of the circuit board 18. This makes it easy to provide electrical connection therebetween. Further by providing the conductive parallel springs 24 also in the support portion 14, the distance of the electrical connection with the connection pad 19 of the circuit board 18 is defined, and at the same time the parallel springs 15 can be fixed with a length exceeding a certain value. A hollow portion is provided in the parallel springs 24 functioning as the conductive portion to reduce the capacitance value. The dummy portion 23 is provided in the hollow portion to reinforce the probe structure.

Figure 4:
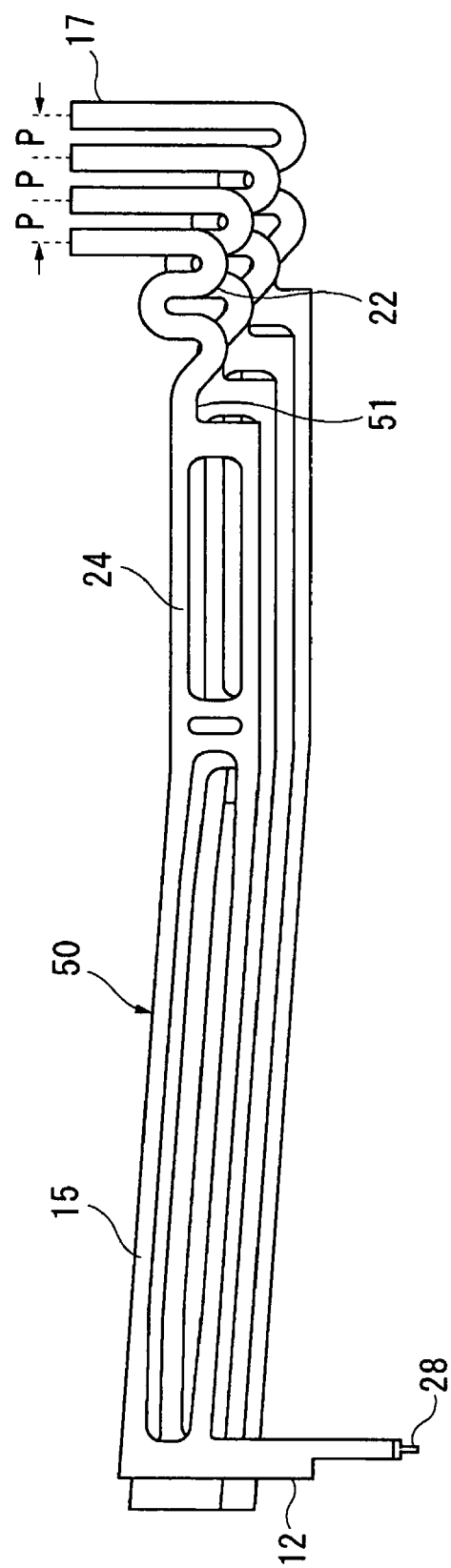
FIG. 4 is a perspective view illustrating a probe assembly formed by laminating the vertical probes according to the second embodiment of the present invention.

FIG. 4 is a view showing the state in which several sheets of the resin film with probe described with reference to FIG. 3 are laminated. However, FIG. 4 shows the state in which only the portions each including the probe, parallel springs, and support portion are laminated, and does not show the resin films. As seen from FIG. 4, the terminal portions 17 are previously formed in the resin films 25 in such a way that the phases of the terminal portions 17 to be the electrical connection portions are displaced by the same pitch P when the resin films with probe are laminated. This is in line with the connection pads 19 previously arranged in an oblique direction, which is an easy way to arrange the connection pads 19 when provided as the electrical connection portions of the circuit board 18 to be connected to the terminal portions 17.

Figure 5:
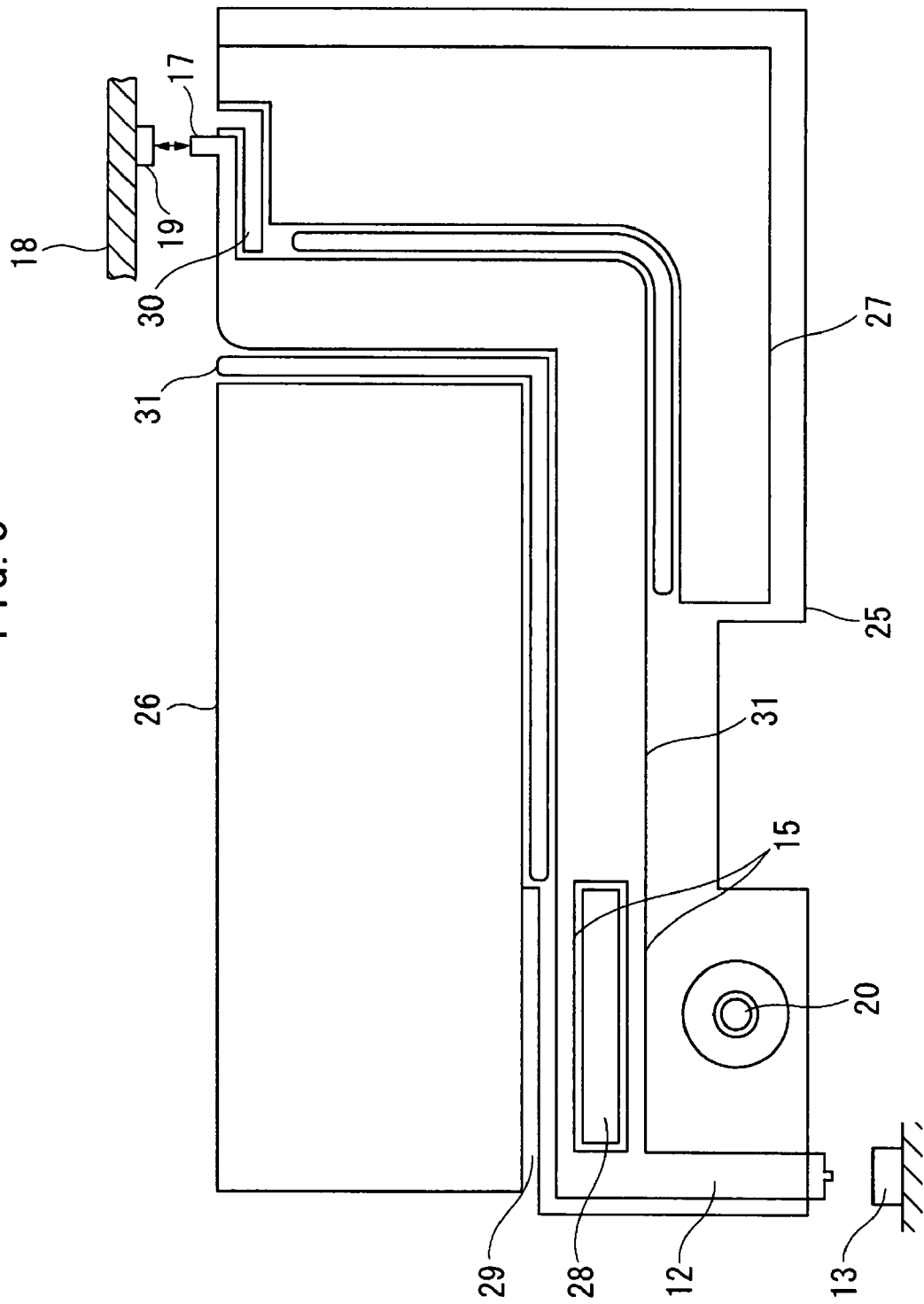
FIG. 5 is a top view showing a third embodiment of the vertical probe according to the present invention.

FIG. 5 is a top view showing a third embodiment of the present invention. Features of this embodiment are as follows: an opening 28 and a cut 29 are provided in a portion in which the parallel springs 15 are formed on the resin film 25; and a cut 30 is provided in a portion in which the terminal portion 17 is provided for electrical connection with the circuit board 18. As shown in FIG. 5, the copper foil attached to the resin film 25 is separately formed into a portion to be a conductive portion and portions to be electrical dummy portions 26, 27 serving also as reinforcing portions. The portion to be the conductive portion has the vertical probe 12 formed on an end thereof, and has the terminal portion 17 formed on the other end side to contact the connection pad 19 which is the electrical connection portion of the circuit board 18. The dummy portions 26, 27 are provided for maintaining the deformation strength as the film with probe (namely, for preventing the resin film 25 from being deformed), because the resin film 25 is thin with a thickness of 5 μm while the copper foil has a thickness of 20 μm.

Further the vertical probe 12 is formed so as to be the link mechanism having the parallel springs 15. The opening 28 is provided in a portion of the resin film 25 between the parallel springs 15, and the cut 29 is provided in parallel to the link mechanism. This forms the cantilever structure including the vertical probe 12 as a whole. Further the cut 30 is provided along the terminal portion 17 which is also the cantilever structure based on the length of the cut. As described above, by forming the probe portion as the cantilever structure by the parallel spring mechanism, the width of the conductive wiring 31 can be widened. Thus it is possible to increase the deformation strength of the resin film 25 compared to the conventional structure in which the curved portion is provided at a middle of one vertical probe. By also forming the terminal portion 17 as the cantilever structure, the circuit board 18 and the vertical probe 12 can be electrically connected by only elastic contact. Thus it is possible to easily attach the circuit board 18 and the probe assembly.

Further insulation adhesives are filled into gaps between the conductive wiring 31 connecting the vertical probe 12 and the terminal portion 17, and each of the dummy portions 26, 27 in order to maintain the electrical insulation properties and film strength. The insulation adhesives serve as spacers for reinforcement. In the resin film 25 adjacent to the vertical probe 12, there is provided the hole 20 through which the support rod passes to position and fix the resin film 25 upon lamination.

Figure 6:
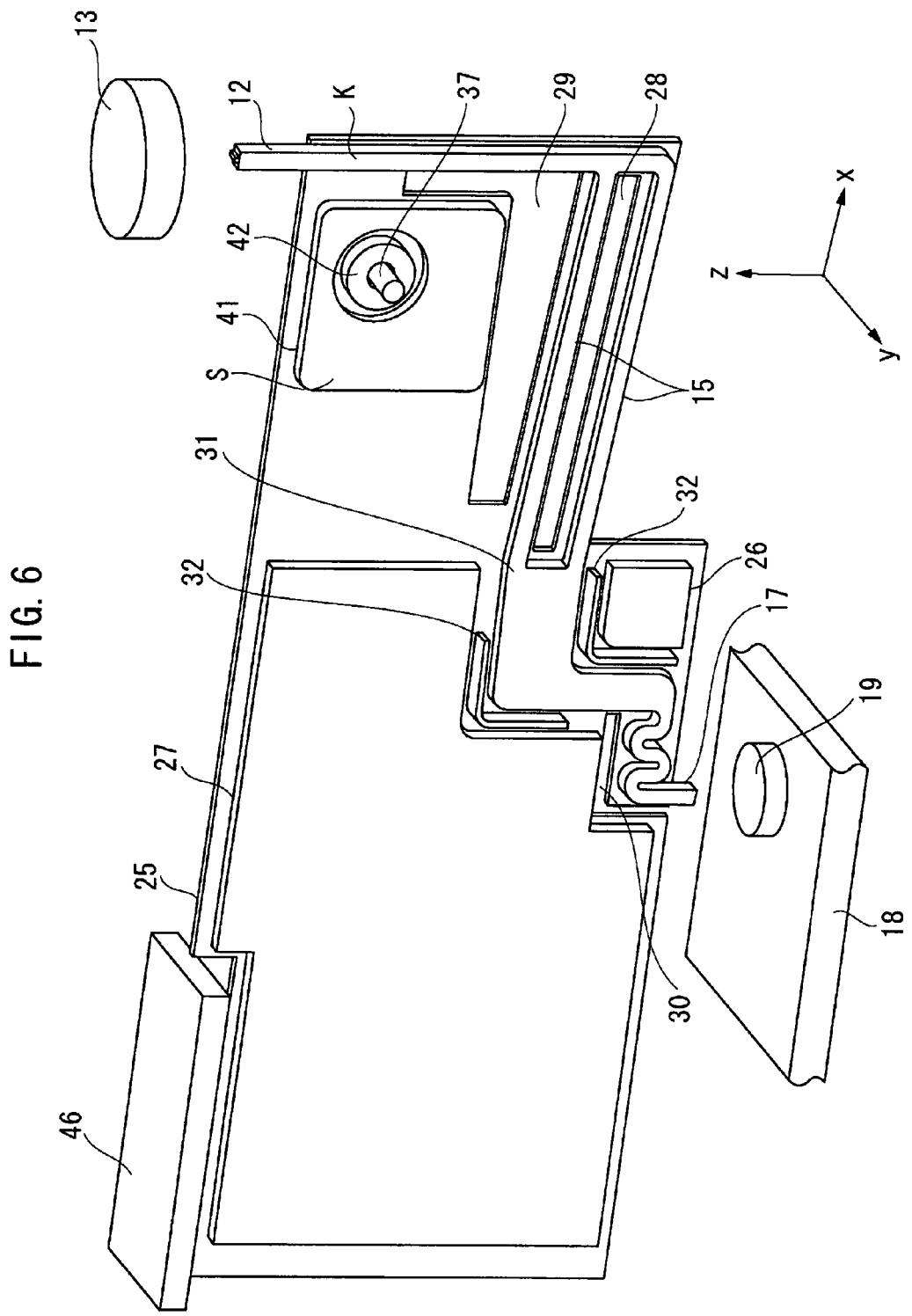
FIG. 6 is a top view showing a fourth embodiment of the vertical probe according to the present invention.

FIG. 6 is a top view showing a fourth embodiment of the present invention. Features of this embodiment are as follows: an opening and a cut are provided in a portion in which the parallel springs are formed on the resin film; and a cut is also provided in a portion in which the terminal portion is provided for electrical connection with the circuit board. As shown in the figure, the copper foil attached to the resin film 25 is separately formed into a portion to be a conductive portion and portions to be electrical dummy portions serving also as reinforcing portions. The portion to be the conductive portion has the vertical probe 12 formed on one end side thereof, and has the terminal portion 17 formed on the other end side to contact the connection pad 19 which is the electrical connection portion of the circuit board 18. The dummy portions 26, 27 are provided for maintaining the deformation strength as the film with probe, because the resin film 25 is thin with a thickness of 5 μm while the copper foil has a thickness of 20 μm. The dummy portion 27 is tightly fixed between an upper fixing plate 46 and the circuit board 18. Adhesives 32 are filled between the conductive wiring 31 and the dummy portion 27 as well as between the conductive wiring 31 and the dummy portion 26. In this way the conductive wiring 31 which is the fixing portion of the parallel springs 15 is tightly fixed. The adhesive 32 is not necessarily an adhesive and may be the same material as the film. It is appropriate to use polyimide or other material as a film adhesive.

The vertical probe 12 is formed so as to be the link mechanism having the parallel springs 15. The opening 28 is provided in a portion of the resin film 25 between the parallel springs 15, and the cut 29 is provided in parallel to the link mechanism. This forms the cantilever structure including the vertical probe 12 as a whole. Further, a cut 30 is provided along the terminal portion 17 which is also the cantilever structure based on the length of the cut. As described above, by forming the probe portion as the cantilever structure by the parallel spring mechanism, the width of the conductive wiring 31 can be widened. Thus it is possible to increase the deformation strength of the resin film 25 compared to the conventional structure in which the curved portion if provided at a middle of one vertical probe. The conductive wiring 31 has a shape in which the space and the dummy portion 23 do not exist in the conductive portion 24. Further by forming the terminal portion 17 as the cantilever structure, the circuit board 18 and the vertical probe 12 can be electrically connected by only elastic contact. Thus it is possible to easily attache the circuit board and the probe assembly.

Further the insulation adhesives 32 are filled into the gaps between the conductive wiring 31 connecting the vertical probe 12 and the terminal portion 17, and each of the dummy portions 26, 27 in order to maintain the electrical insulation and film strength. The insulation adhesives serve as spacers for reinforcement. In the resin film 25 adjacent to the vertical probe 12, there is provided the hole 20 through which the support rod passes to position and fix the resin film 25 upon lamination.

Figure 7:
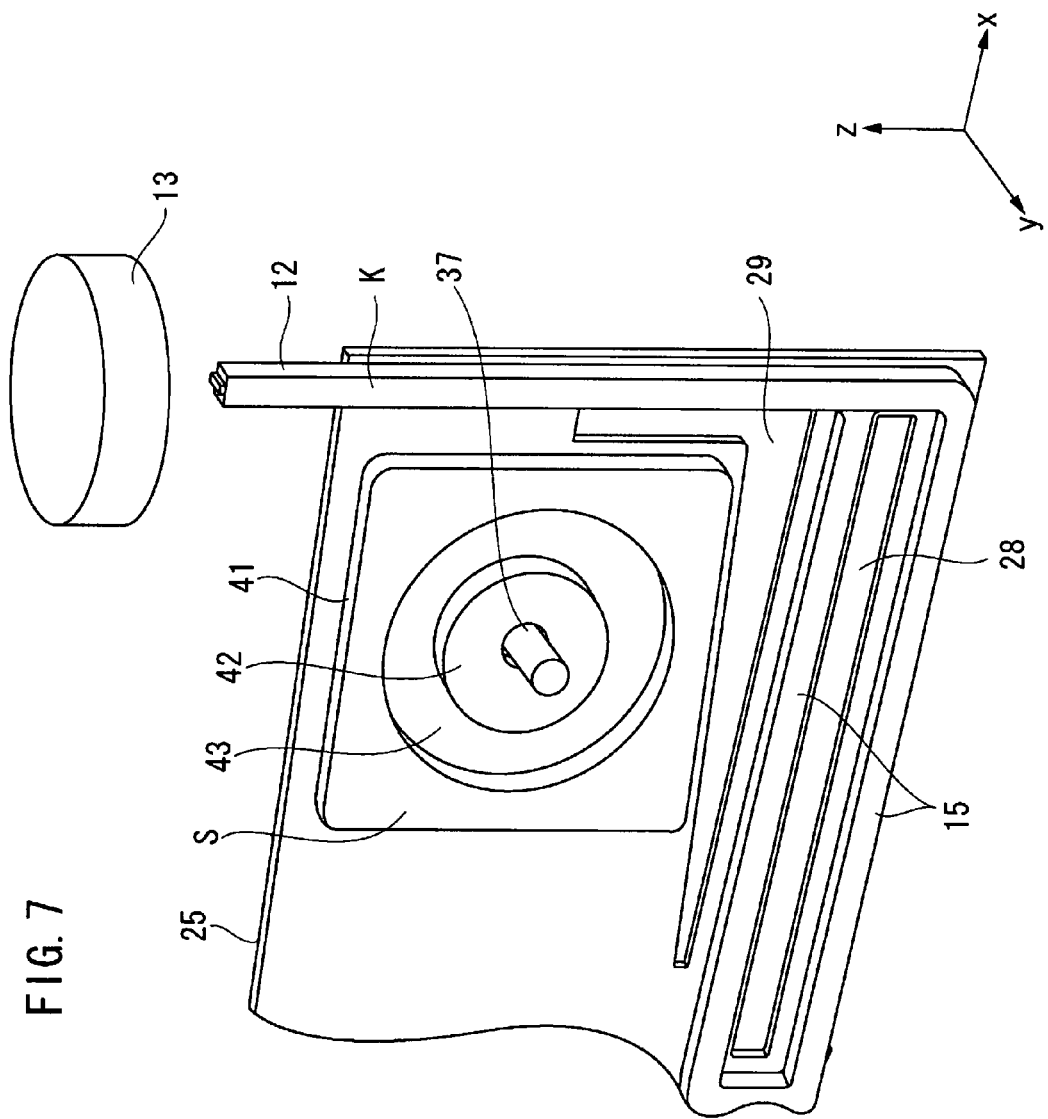
FIG. 7 is a partial enlarged view in the vicinity of a base end portion of the vertical probe according to the fourth embodiment of the present invention.

FIG. 7 is a partial enlarged view in the vicinity of the vertical probe 12 of FIG. 6. In FIG. 7, when the end portion of the probe 12 varies in the z direction during proving operation, a force may be transmitted to the other vertical probes 12 through the support rod 37.

This embodiment is to prevent the transmission of force. In FIG. 7, reference numeral 41 denotes an outer positioning dummy portion, 42 denotes an inner dummy portion, and 43 denotes a resin film deformed portion. The outer positioning dummy portion 41 and the inner positioning dummy portion 42 are located very close to the vertical probe 12. The hole 20 is created on the same axis in the inner positioning dummy portion 42 and the resin film 25. The support rod 37 is inserted into the hole 20 by press fitting to position the resin film 25 and the outer positioning dummy 41 according to the lamination pitch. Since the resin film 25, the inner positioning dummy portion 42, and the outer positioning dummy portion 41 are located very close to the vertical probe 12, the distance involved in displacement of the vertical probe 12 is reduced, so that the end can be assembled with high accuracy.

With the configuration as described above, the pad portions descend and plural vertical probes 12 are simultaneously pushed down in the z direction downward in the figure by the probing operation. At this time, a force is applied to the support rod 7 when the end portions of the vertical probes 12 vary in the z direction. In order to reduce this force, the resin film deformed portion 43 is provided between the outer positioning dummy portion 41 and the inner poisoning dummy portion 42. FIG. 7 does not show a cut in the resin film deformed portion 43, but an appropriate cut may exist for the purpose of properly determining the spring constant.

In the embodiment, preferably a surface K of the vertical probe 12 and a surface S of the outer positioning dummy portion 41 are in the same plane. Further, preferably a large force is not applied to the positioning dummy portion even if the probing operation is performed in the z direction of the vertical probe 12. This is because each probe is necessary to operate independently.

Figure 8:
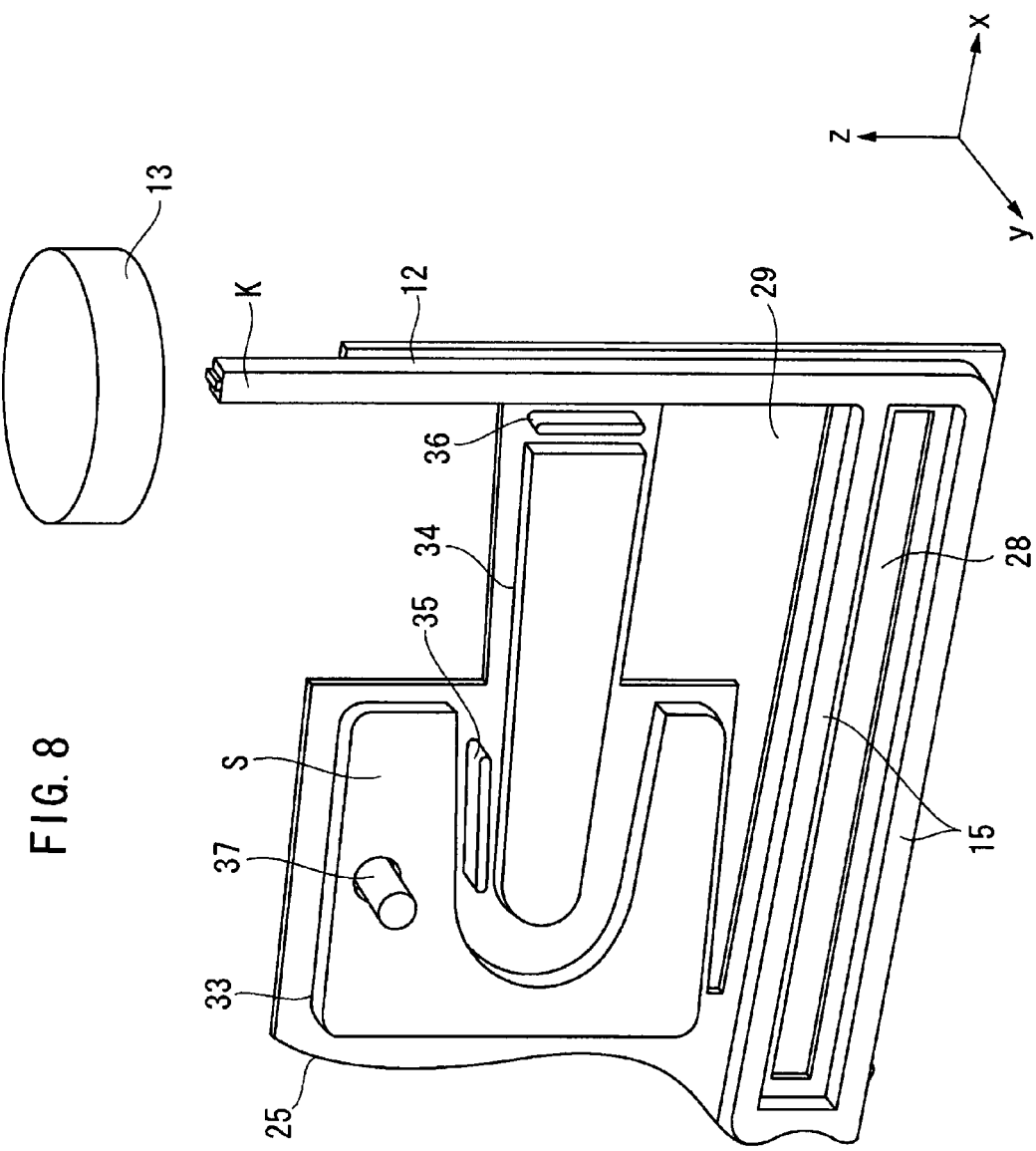
FIG. 8 is a partial view of a scheme to facilitate making the same plane in the fourth embodiment of the present invention.

FIG. 8 is a partial view of a scheme to facilitate making the same plane. In FIG. 8, reference numeral 34 denotes a coupling dummy portion 34. The coupling dummy portion 34 exists between the vertical probe 12 and a positioning dummy portion 33. A resin material 35 exists between the positioning dummy portion 33 and the coupling dummy portion 34. A dummy portion 36 is provided between the coupling dummy portion 34 and the vertical probe 12 in order to increase strength. The positioning dummy portion 33 is located in the vicinity of the vertical probe 12. Further, the hole 20 passing through the positioning dummy portion 33 and the film 25 as well as one end of the coupling dummy portion 34 are both close to the vertical probe 12. This configuration facilitates making the vertical probe 12, the coupling dummy portion 34, and the positioning dummy portion 33 to be in the same plane.

In the aspect shown in FIG. 8, like in the aspect shown in FIGS. 6 and 7, it is preferable that the surface K of the vertical probe 12 and the surface S of the positioning dummy portion 33 are in the same plane. It is also preferable that a large force is not applied to the positioning dummy portion 33 even if the probing operation is performed in the z direction of the vertical probe 12. This is because each probe is necessary to operate independently. The coupling dummy portion 34 is formed on the tape to reduce (or prevent) the bending of the resin film 25 or tape in the y direction.

The coupling dummy portion 34 and the positioning dummy portion 33 have a long common portion in the x direction seen from the z direction, and thereby the surface of the vertical probe 12 and the surface of the coupling dummy portion 34 properly act within the same plane. For this reason the force transmission is unlikely to occur in another contact assembly through the hole 20 and the support rod.

Figure 9:
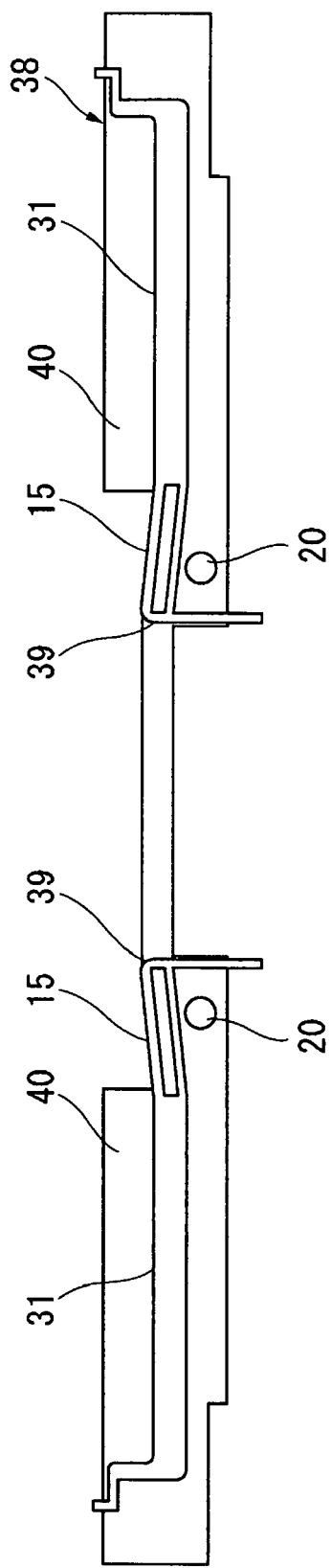
FIG. 9 is a top view showing an example of a resin contact assembly according to the present invention.

A fifth embodiment of the present invention will be described with reference to FIGS. 9 to 13. FIG. 9 shows a resin contact assembly. In FIG. 9, reference numeral 39 denotes a conductive probe that is equivalent to the vertical probe 12 described in the first embodiment and other embodiments. Reference numeral 40 denotes a resin film, 15 denotes the parallel springs, and 31 denotes the conductive wiring. To simplify the drawing the dummy portions and other portions are omitted but actually exist and function. The resin film 40 has the same function as the resin film 25. A contact assembly 38 is formed by providing two conductive probes 39 in total, one on the left side and the other on the right side.

Figure 10:
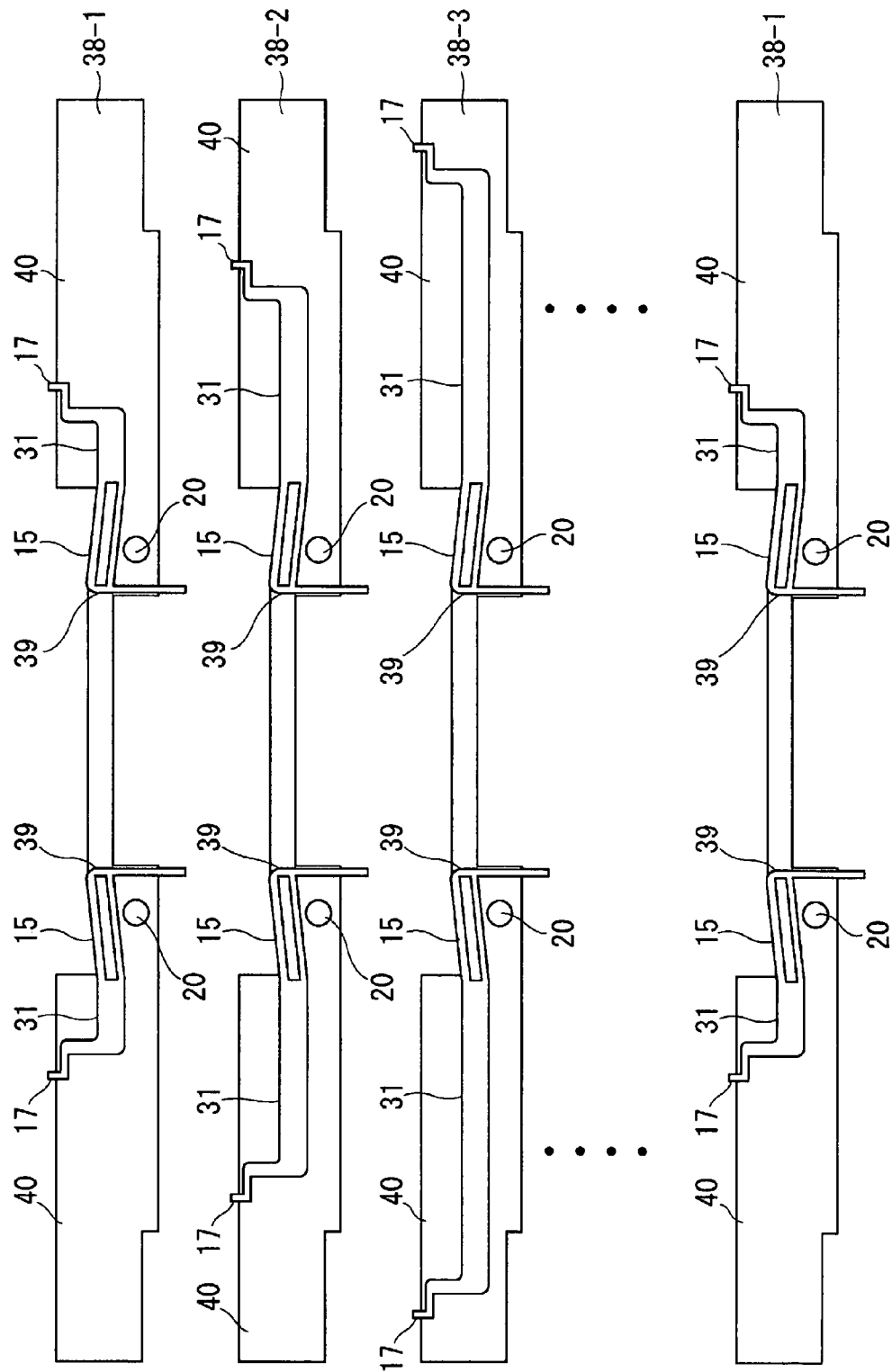
FIG. 10 is a top view showing the arrangement order of plural the resin contact assemblies according to the present invention.

FIG. 10 shows plural the contact assemblies 38 each having the conductive wiring 31 of different length, in the order of assembly. In FIG. 10, it is shown that the contact assemblies each having the conductive wiring 31 of different length are repeatedly arranged as 38-1, 38-2, 38-3 ... 38-1 ..., in the order from the shortest length.

Figure 11:
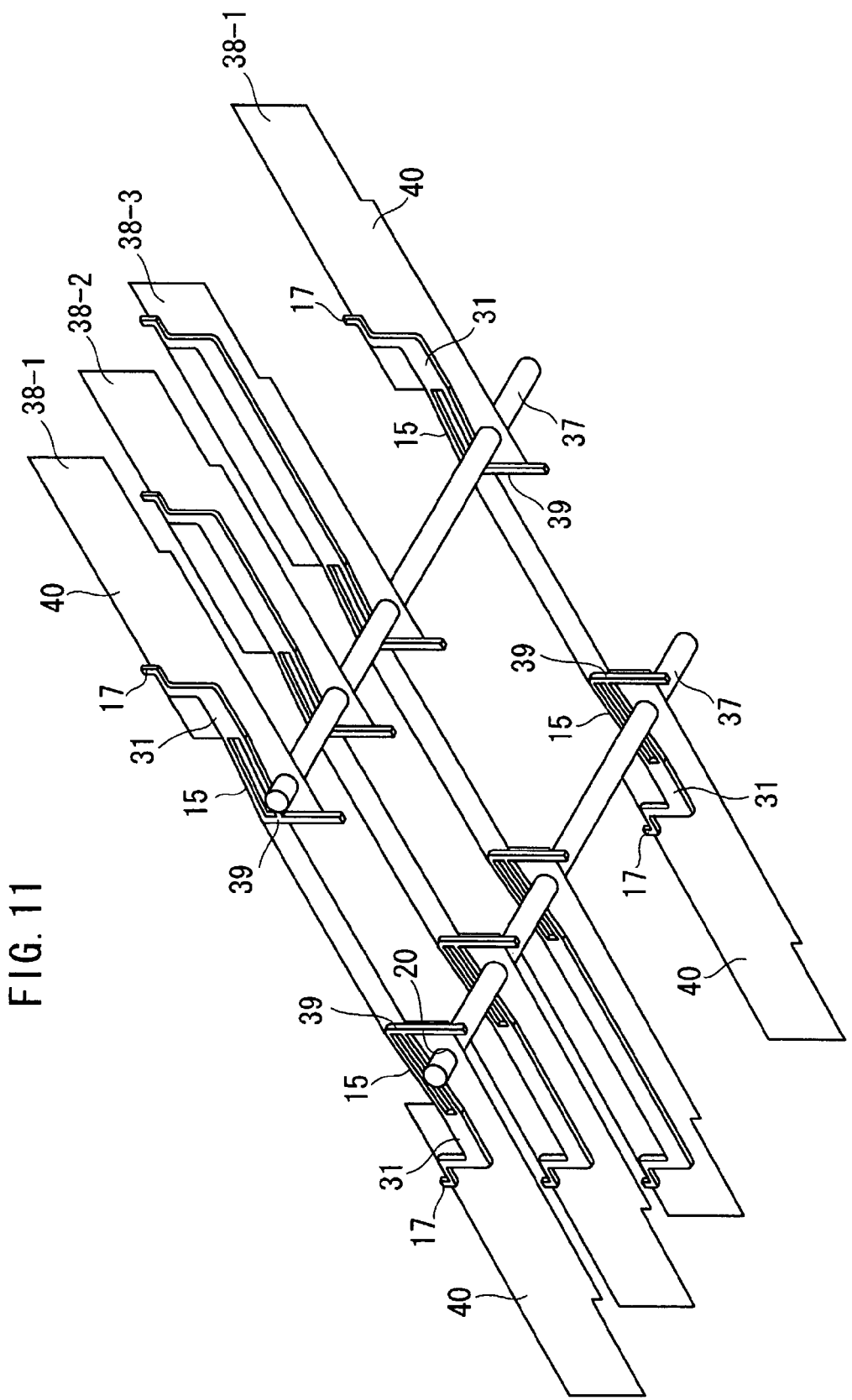
FIG. 11 is an assembly perspective view of plural the resin contact assemblies according to the present invention.

FIG. 11 is an assembly perspective view of plural the contact assemblies 38 according to the present invention. In FIG. 11, the contact assemblies 38 shown in FIG. 10 are assembled in which the support rods 37 are inserted into the holes 20. The holes 20 and the support rods 37 are press fitted to position the contact assemblies 38. In this way the distance between each of the contact assemblies 38 is determined.

Figure 12:
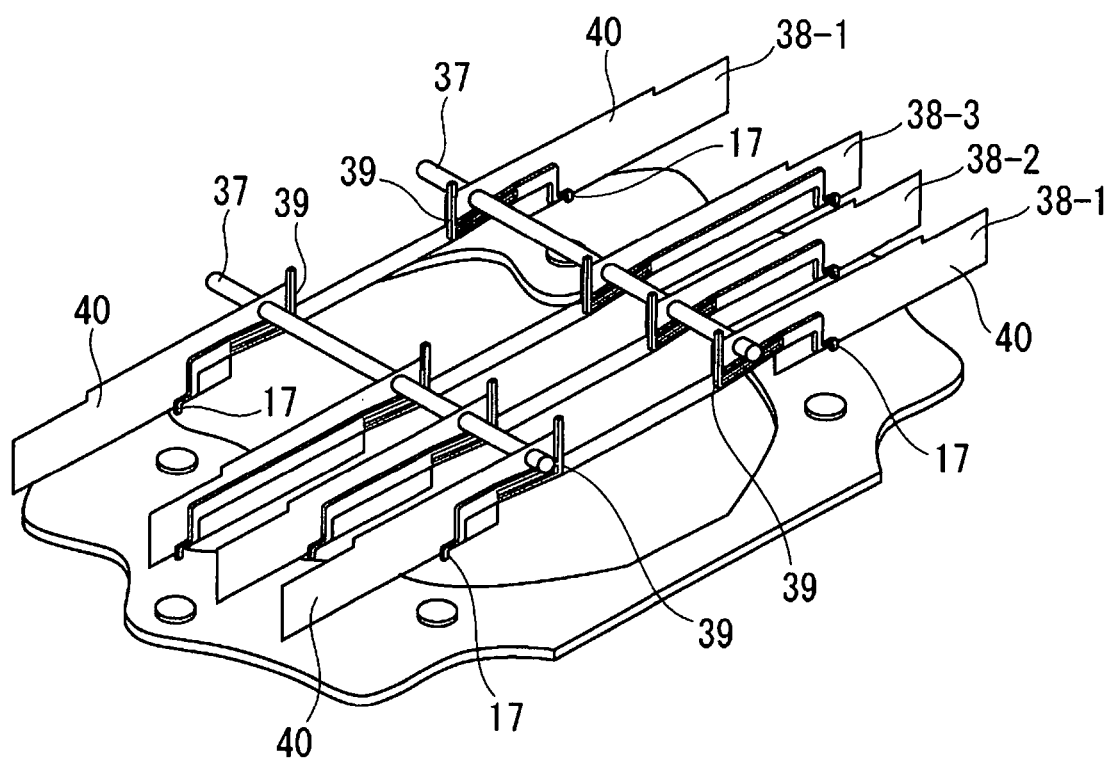
FIG. 12 is a perspective view showing the facing relationship between terminal portions of plural the resin contact assemblies according to the present invention and connection pads on a wiring board.

FIG. 12 is a view showing the state in which the terminal portions of plural the contact assemblies 38 according to the present invention are caused to face the connection pads on the wiring board. In FIG. 12, the terminal portions 17 of the contact assemblies 38 and the connection pads 19 are facing each other.

Figure 13:
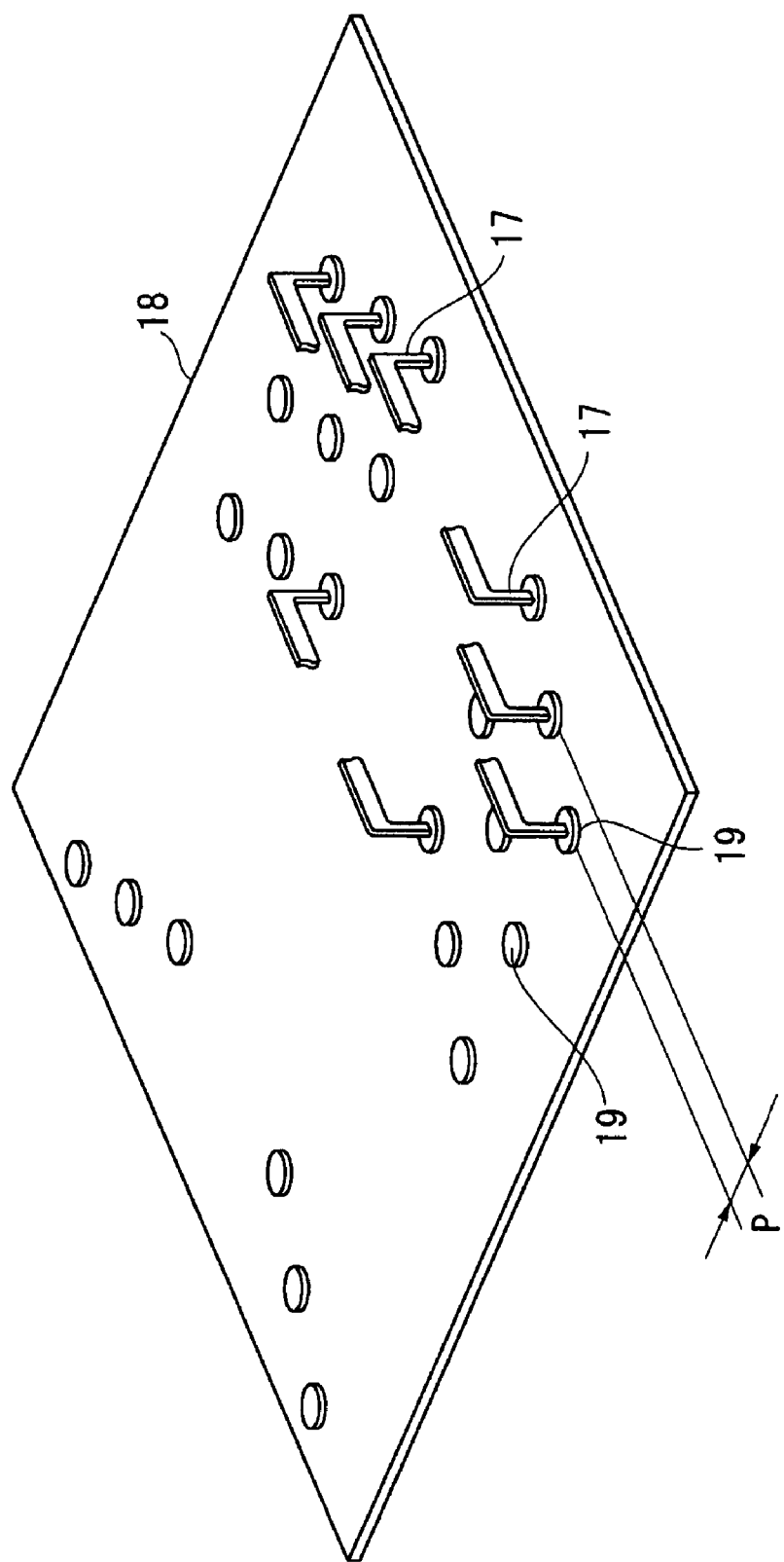
FIG. 13 is a view showing the corresponding relationship between the terminal portions of plural the resin contact assemblies according to the present invention and the connection pads on the wiring board.

FIG. 13 shows the corresponding relationship between the terminal portions 17 and the connection pads 19. When the contact assemblies 38 each having the conductive wiring 31 of different length are laminated, the difference between the lamination pitch and the wiring length is given by the relationship indicated in FIG. 13. This shows that the terminal portions 17 can be connected to the connection pads 19 of rough pitch on the circuit board 18.

Figure 14:
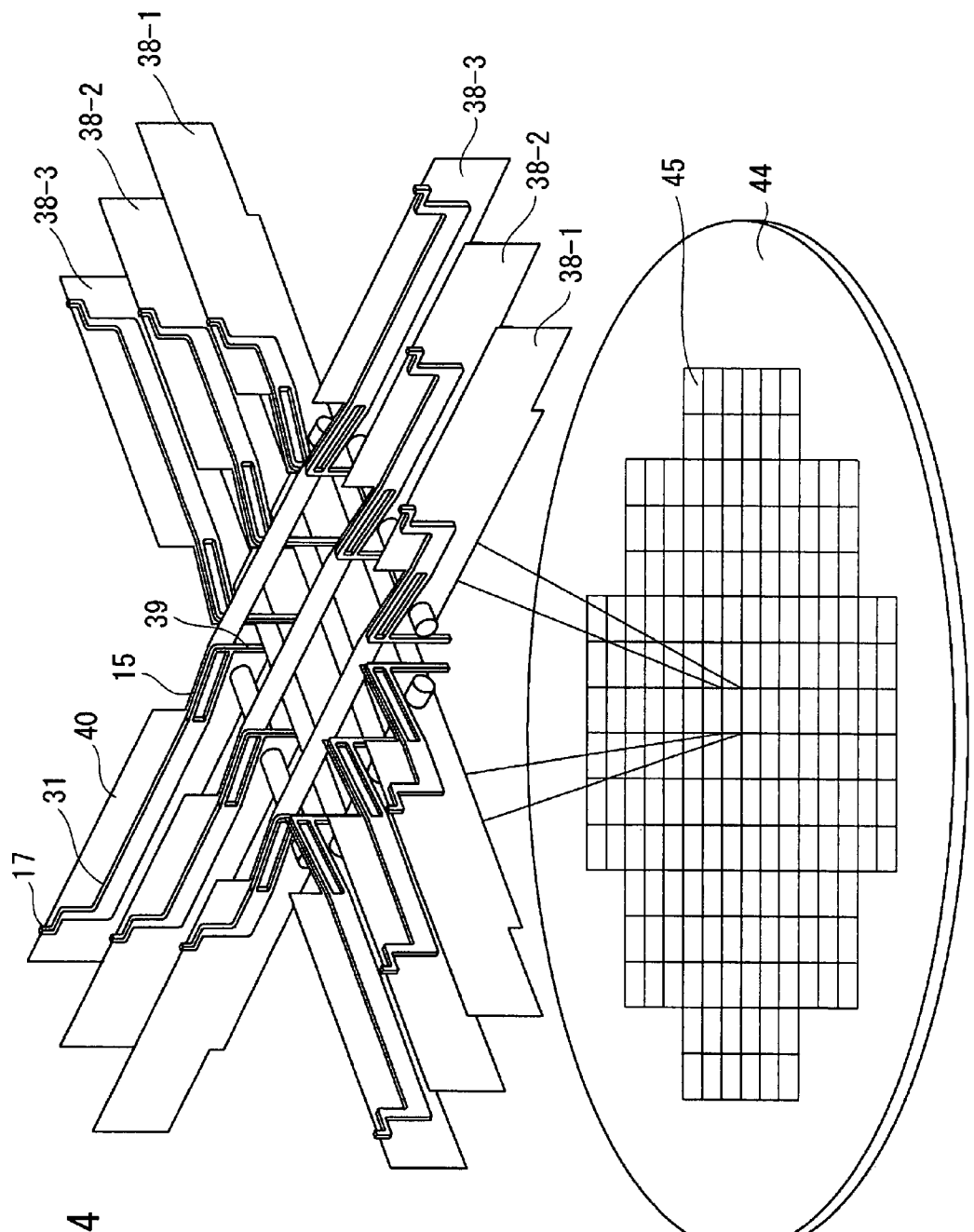
FIG. 14 is a perspective view showing the state in which plural the resin contact assemblies according to the present invention are facing the pads arranged on four sides.

FIG. 14 shows a resin contact assembly facing the pads arranged on four sides, according to the present invention. In FIG. 14, plural the contact assemblies 38 shown in FIGS. 12 and 13 are laminated and connected to the pads arranged on two opposite sides of a rectangular, and plural the contact assemblies 38 laminated in a substantially similar way, are connected to the pads arranged on the remaining two sides, the former and the latter being orthogonal to each other. Here reference numeral 44 denotes a wafer, 45 denotes a chip having pads on a rectangle. As shown in FIG. 14, the vertical probes 12 arranged in a rectangular shape are facing the chip 45 having the pads on the rectangle.

Figure 15:
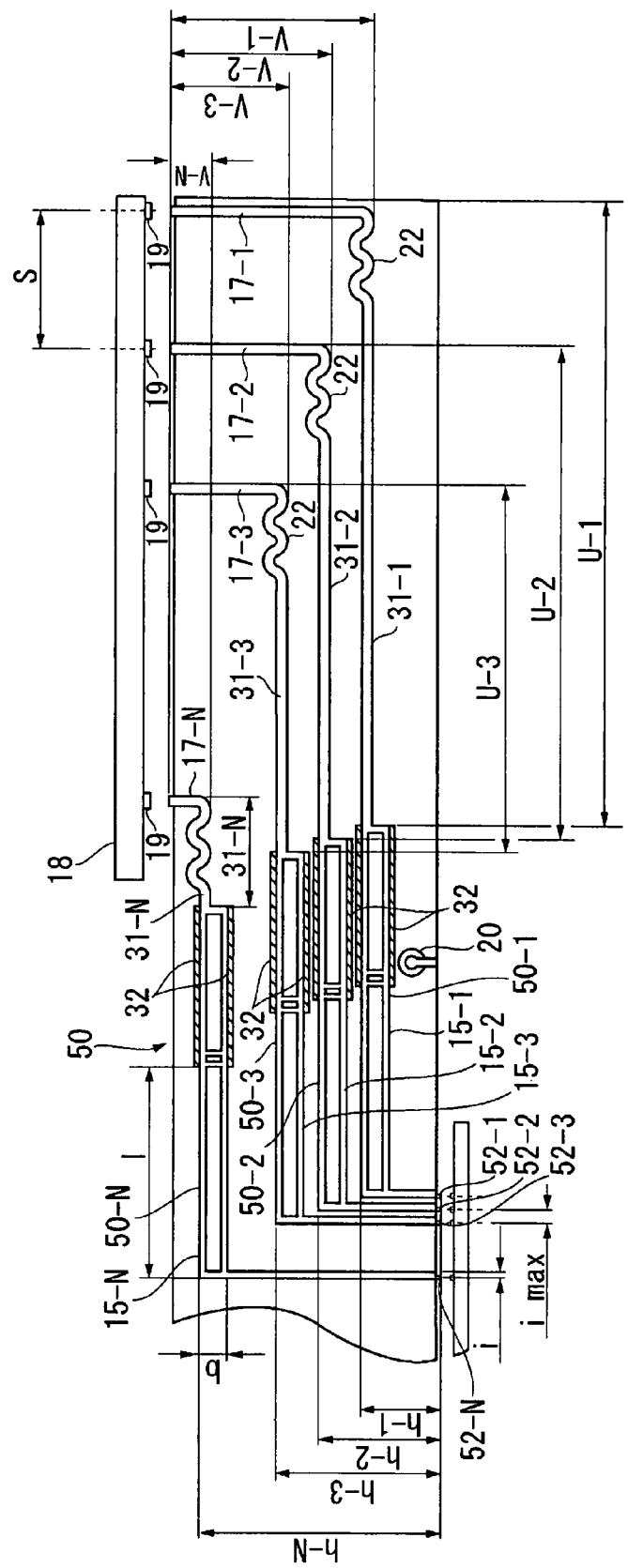
FIG. 15 is a front view showing the left half of a resin-probe complex tape assembly according to a sixth embodiment of the present invention.

FIG. 15 is a view showing a sixth embodiment of the present invention, in which a part of the second embodiment of the present invention is modified. Incidentally, a resin-probe complex tape is denoted by reference numeral 50 which is indicated in FIG. 3 for illustrating the second embodiment of the vertical probe according to the present invention (except for the circuit board 18 and the connection pad 19). Reference numeral 31 denotes the wiring portion, 52 denotes an input portion.

FIG. 15 shows the right half of a resin-probe complex tape assembly having plural the resin-probe complex tapes 50. In FIG. 15, there are arranged resin-probe complex tapes 50-1, 50-2, 50-3, and 50-N which are substantially the same as the resin-probe complex tape 50 shown in FIG. 3. Parallel springs 15-1, 15-2, 15-3, and 15-N of the respective resin-probe complex tapes are arranged displaced in height direction and in longitudinal direction. Further, heights h-1, h-2, h-3, and h-N are given to the respective resin-probe complex tapes in FIG. 15, based on the height h indicated in FIG. 3. Further, conductive wirings 31-1, 31-2, 31-3, and 31-N are different in length, through which the terminal portions and the electrodes of the circuit board 18 are press connected to each other. The distance between the electrodes is S. The curved portion 22 is a spring provided to equalize the press fitting force. It is assumed that the heights of the terminal portions 17 are V-1, V-2, V3, and V-N, respectively. The terminal portions 17 have different heights so as to be electrically connected to the electrodes of the circuit board 18.

In FIG. 15, the parallel springs 15-1, 15-2, 15-3, and 15-N are arranged in different spaces in the height direction. In this way freedom of selection in the length l and width d of the parallel springs 15-1, 15-2, and 15-N is increased, regardless of the pad pitch.

As shown in FIG. 15, input portions 52-1, 52-2, 52-3, and 52-N are arranged at an interval of i max.

In FIG. 15, the parallel springs 15-1, 15-2, 15-3, and 15-N have the same size. When the same contact force is applied to the input portions 52-1, 52-2, 52-3, and 52-N, the same deformation occurs in the parallel springs 15-1, 15-2, 15-3, and 15-N.

Figure 16:
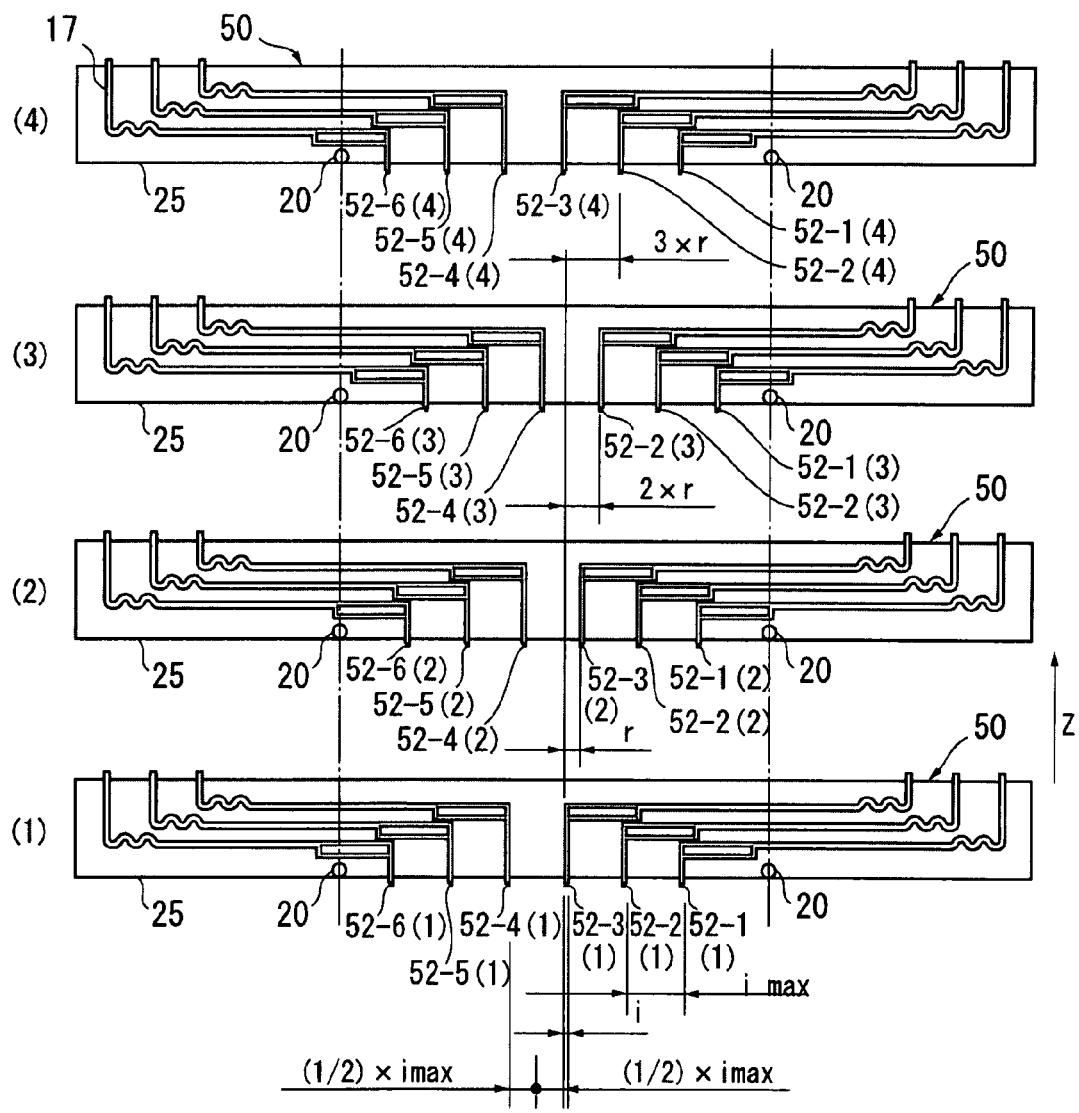
FIG. 16 is a front view showing an assembled unit of the resin-probe complex tape assemblies according to the sixth embodiment of the present invention.

FIG. 16 is a view showing an assembled unit of the resin-probe complex tape assemblies. Reference numerals (1), (2), (3), (4) in FIG. 16 denote the resin-probe complex tape assemblies, respectively. In FIG. 16, the right half of the resin-probe complex tape assembly is arranged on the right side. Further the left half of the resin-probe complex tape assembly, which is symmetrical to the right half of the resin-probe complex tape assembly, is arranged on the left side. The resin film 25 is the common component. In FIG. 16, the input portion is denoted by reference numeral 52. In the resin-probe complex tape assembly (1), all the input portions 52-1(1), 52-2(1), 52-3(1), and 52-N(1) on the left and right sides have the same center distance of i max. Similarly in the resin-probe complex tape assemblies (2), (3), (4) shown in FIG. 16, the input portions are arranged in the order 52-1, 52-2, and so on.

The right half of the resin-probe complex tape assembly is arranged on the right side. The left half of the resin-probe complex tape assembly, which is symmetrical to the right half of the resin-probe complex tape assembly, is arranged on the left side. In this way, substantially the same number of wirings are provided to both sides.

The resin-probe complex tape assemblies (2), (3) (4) exist in a similar way to the resin-probe complex tape assembly (1). The relationships of the resin-probe complex tape assemblies (1), (2), (3), (4) in FIG. 16 are as follows. Based on the input portion 52-1(1) of the resin-probe complex tape assembly (1), the input portion 52-1(2) of the resin-probe complex tape assembly (2) is arranged at a position moved (namely, a position displaced) by distance r in the right direction. Similarly based on the input portion 52-1(1) of the resin-probe complex tape assembly (1), the input portion 52-1(3) of the resin-probe complex tape assembly (3) is arranged at a position moved by distance 2r in the right direction. Based on the input portion 52-1(1) of the resin-probe complex tape assembly (1), the input portion 52-1(4) of the resin-probe complex tape assembly (4) is arranged at a position moved by distance 3r in the right direction. On the other hand, the holes 20 are located on the same line through all the resin-probe complex tape assemblies (1), (2), (3), (4). On the left and right sides, the terminal portions 17-1, 17-2, 17-3, and 17-N (see FIG. 15) are located at positions properly facing the connection pads 19. The lengths of the conductive wirings 31-1, 31-2, 31-3, and 31-N are adjusted so that the connection pads 19 and the terminal portions 17-1, 17-2, 17-3, and 17-N face each other.

The holes 20 are at positions having the same distance from the center line on the left and right sides through all the resin-probe complex tape assemblies (1) (2), (3), (4).

Figure 17:
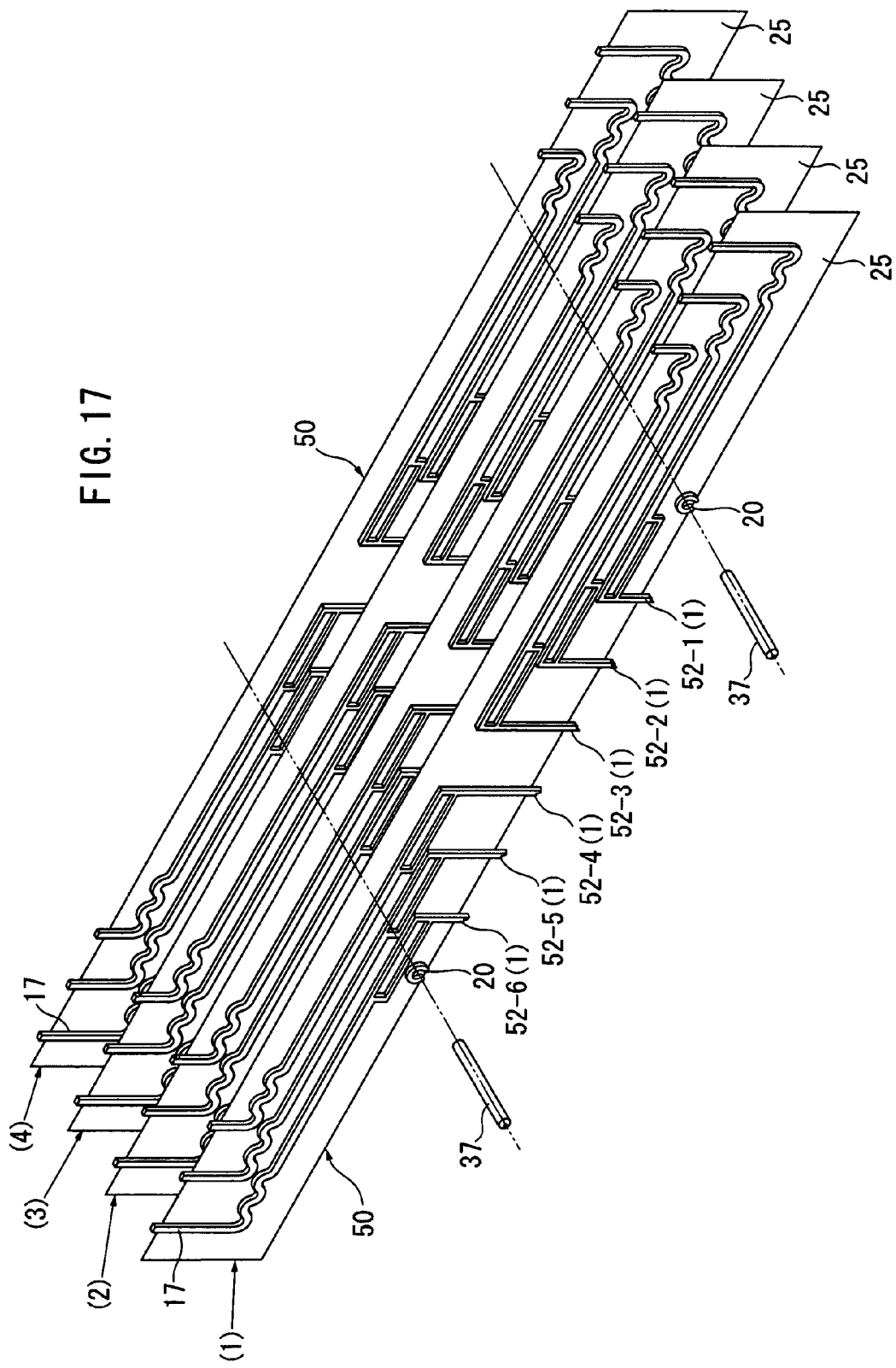
FIG. 17 is a perspective view showing the state in which plural the resin-probe complex tape assemblies according to the sixth embodiment of the present invention are laminated and arranged.

FIG. 17 is a perspective view showing the lamination state of the resin-probe complex tape assemblies. The resin-probe complex tape assembly (1) of FIG. 17 is the same as the resin-probe complex tape assembly (1) of FIG. 16. As shown in FIG. 17, the support rods 37 are inserted into the holes 20 and press fitted through all the resin-probe complex tape assemblies (1), (2), (3), (4).

Figure 18:
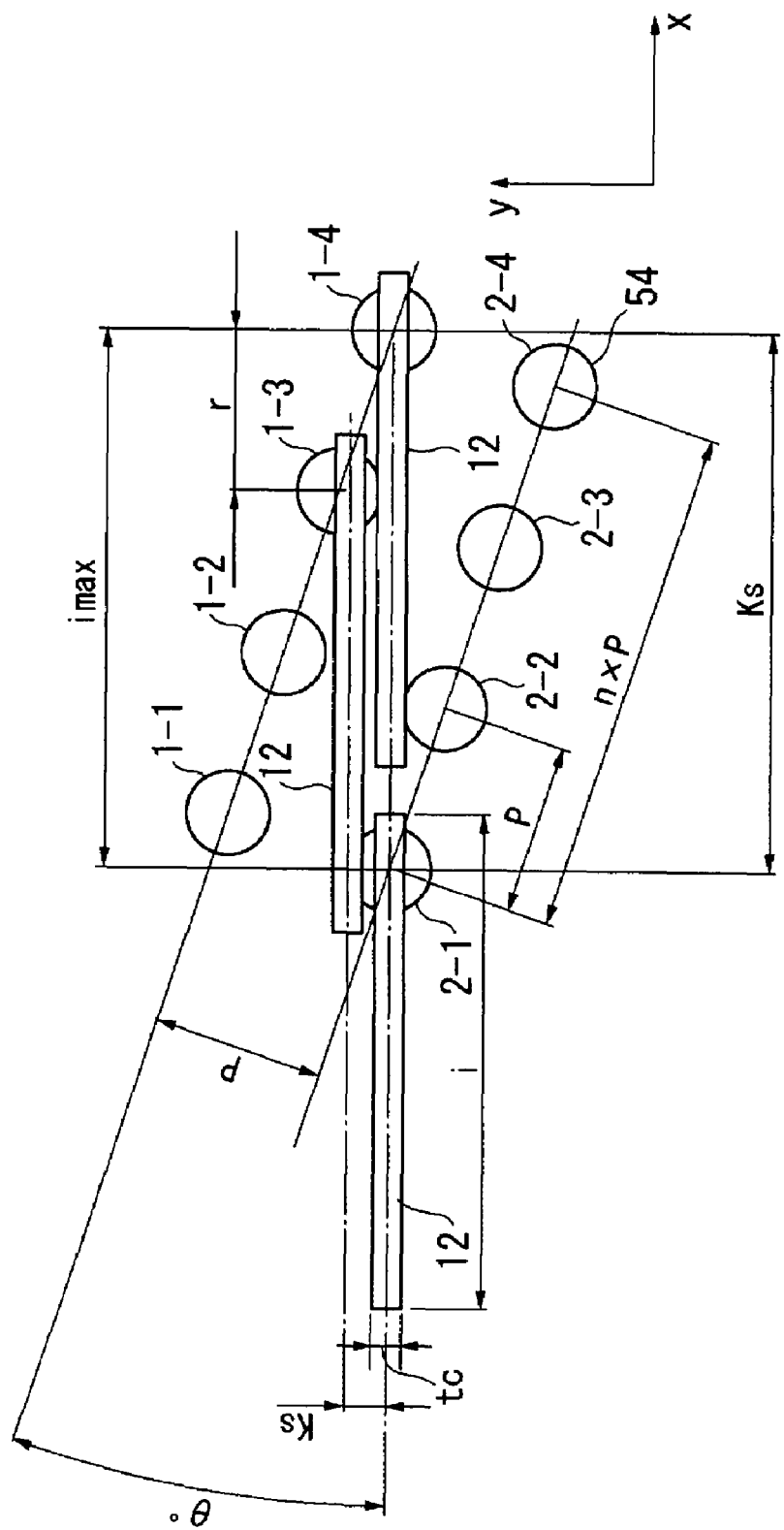
FIG. 18 is an illustrative view for obtaining a maximum board width i max between the vertical probes according to the sixth embodiment of the present invention.
Figure 19:
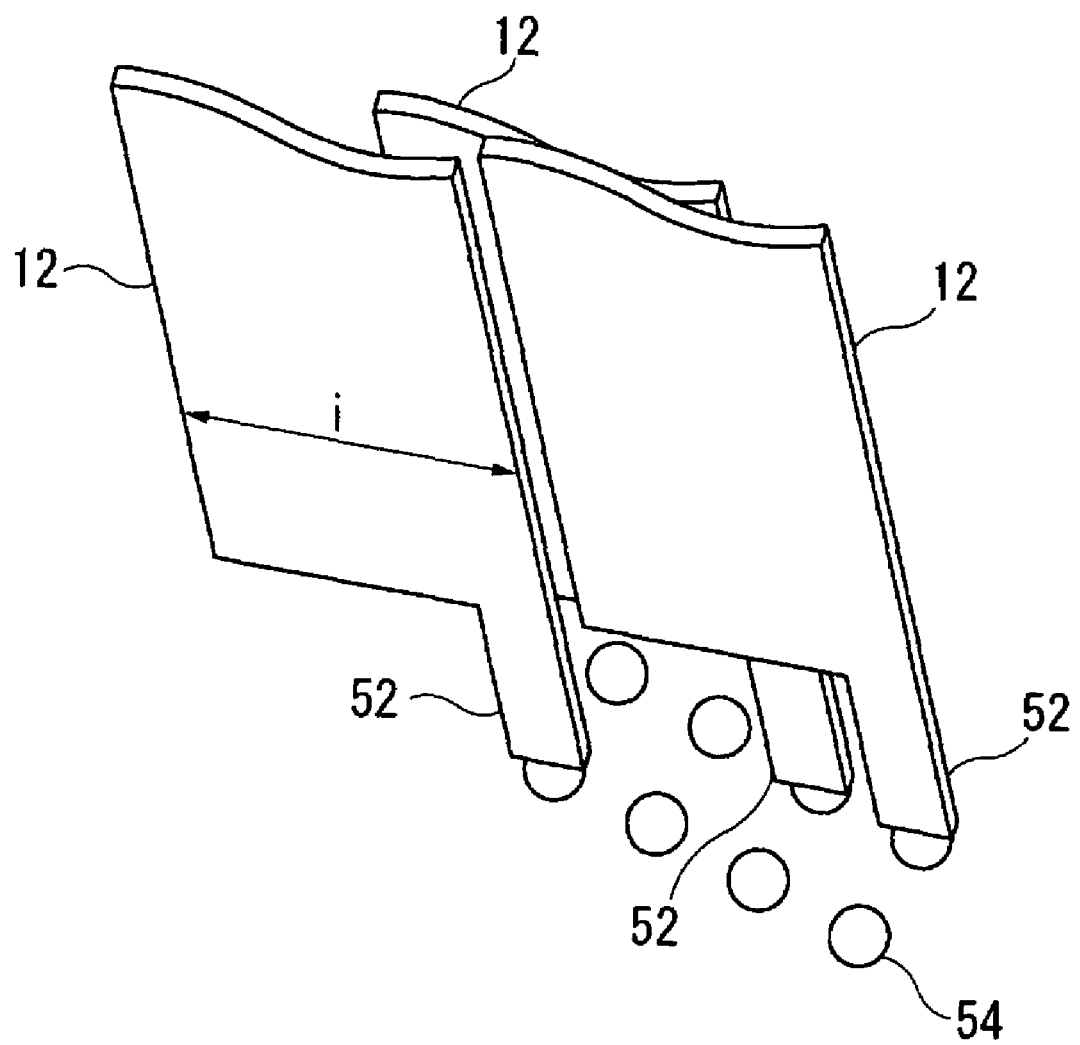
FIG. 19 is a partial enlarged perspective view showing the contact portions between the probe terminals and chip pads shown in FIG. 18, in the sixth embodiment of the present invention.
Figure 20:
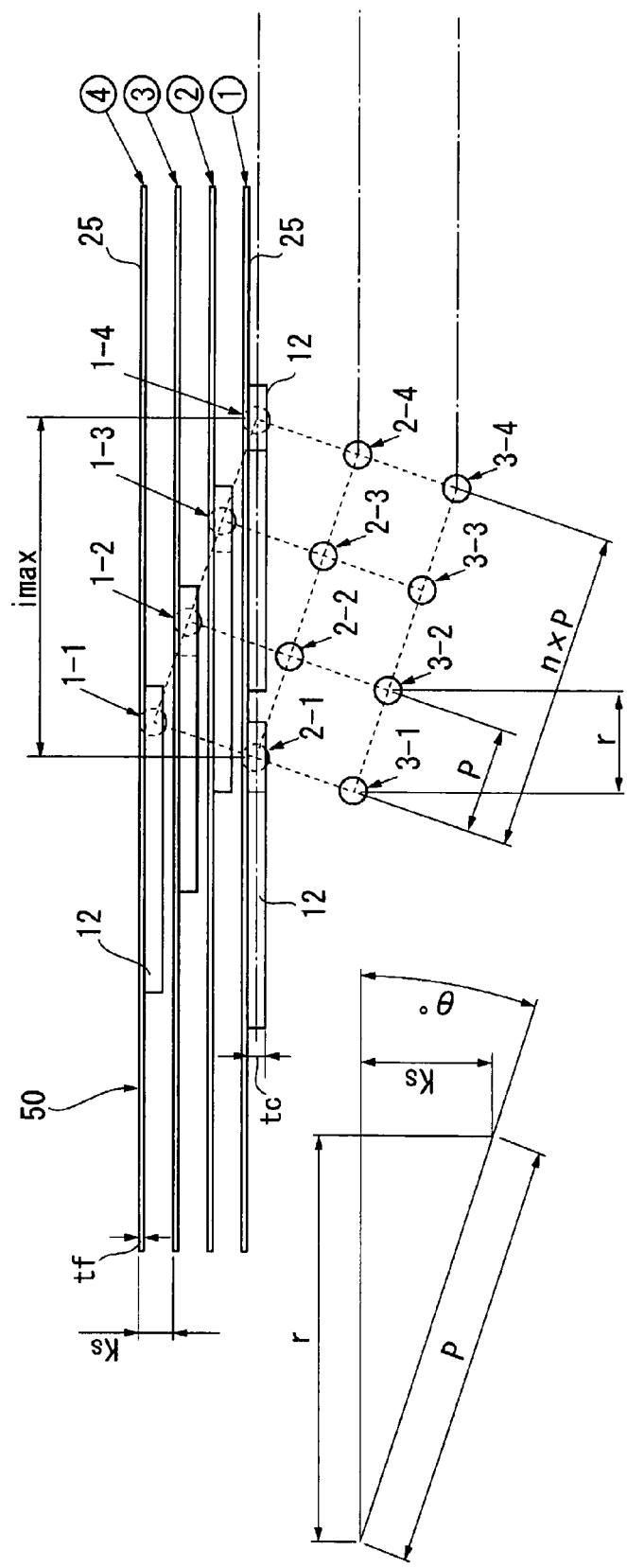
FIG. 20 is a view showing the relative position between the pad arrangement and the pin laminated body arrangement in the sixth embodiment of the present invention.

FIGS. 18 to 20 are illustrative views for obtaining the maximum board width i max between the vertical probes 12. First the symbols used in the figures are explained below.

P: Grid pitch (wafer pad 54 arrangement pitch)
i: Available pin width
i max: Pitch of the input portions 52 on the resin-probe complex tape 50
n: Number of grid pitches occupied by i max
$t_f$: Film thickness (shown in FIG. 20)
$t_c$: Probe pin thickness
$K_s$: Pitch between the resin-probe complex tapes 50
r: Pitch width for shifting the adjacent input portion 52 of the resin-probe complex tape 50.

FIG. 18 shows the case in which the vertical probes 12 are arranged tilted by θ° relative to the wafer pads 54 provided in a grid fashion. Grid points 1-1, 1-2 . . . , 2-3, 2-4 denote positions of the wafer pads 54, respectively.

In FIG. 18, the relationship can be given with respect to θ as follows:

$$\text{Tan } \theta = P/(n \times P)$$

where P is the grid pitch of the wafer pads 54 and n is the number of grid pitches of the wafer pads 54 occupied by the line width i of the vertical probe. At this time, the grid points 1-4 and 2-1 of the wafer pads 54 are on the same line. The pitch i max of the grid points can be obtained by the following equation:

$$i \text{ max} = ((n \times P)^2 + P^2)^{0.5}$$

where i max has the same size as i max indicated in the resin-probe complex tape assembly (1) of FIG. 16. It is only necessary that the line width i of the vertical probe 12 satisfies the following relationship:

$$i < i \text{ max}$$

wherein the value of i can be sufficiently larger than P. This means that it is possible to form a structure with resistance to buckling, even if the height h of the vertical probe 12 increases.

Further, assuming that Ks is the y-direction phase difference between the grid points 1-3 and 1-4 with a tilt angle of θ°, Ks can be obtained by the following equation:

$$Ks = P \times \sin \theta$$

where Ks is the same as the pitch used for laminating the resin-probe complex tape assemblies shown in FIG. 16.

Similarly, assuming that r is the x-direction phase difference between the grid points 1-3, 1-4 with a tilt angle of θ°, r can be obtained by the following equation:

$$r = P \times \cos \theta$$

where r has the same size as r indicated in the resin-probe complex tape assemblies shown in FIG. 16.

FIG. 19 is a three dimensional view of the schematic diagram of FIG. 18. The vertical probes 12 shown in FIG. 19 are the same as the vertical probes 12 shown in FIG. 18.

FIG. 20 is a view showing the relative position between the pad arrangement and the pin laminated body arrangement.

In FIG. 20, grid points 1-1, 1-2 . . . , 3-3, 3-4 of the grids (indicated by dotted lines) show the pad positions of LSI. Parallel horizontal lines in the upper part of the figure are the laminated element tapes each having the probe pin formed thereon. The thickness between the element tapes is Ks. The figure shows that one LSI includes 20 pads in an area array arrangement of the matrices 1-1 to 3-4. Such an LSI is formed over the entire wafer surface and is omitted in the figure. However, the arrays are scattered over the wafer surface in all directions.

The input portion 52-1(1) in FIG. 16 is the same as 1-4 in FIG. 20. The following is a list of the input portions in FIG. 16 and the coordinate numbers in FIG. 20.

| Assembly No. in FIG. 16 | FIG. 16 | Coordinates in FIG. 20 |
|---|---|---|
| (1) | 52-3(1) | 1-4 |
| (1) | 52-2(1) | 2-1 |
| (2) | 52-3(2) | 1-3 |
| (3) | 52-3(3) | 1-2 |
| (4) | 52-2(4) | 1-1 |

A technical point and feature of this method is, as shown in FIG. 20, that the relative position between the probe pins and the area array pads is tilted at an angle θ when they are brought into contact with each other. The angle θ can be determined by the following equation:

$$\text{Tan } \theta = P/(n \times P)$$

where P is the arrangement pitch of the pads and n is the number of grid pitches occupied by i max. The other numerical values can be calculated by the following equations:

$$i \text{ max} = ((n \times P)^2 + P^2)^{0.5}$$

$$r = P \times \cos \theta$$

Here plural sheets of the second embodiment of the vertical probe are arranged on the resin film 25. Each of the vertical probes 12 is laterally shifted with the height h changed to form a hierarchal structure. Thus it is possible to arrange plural probes without damage in the shape and function of the parallel springs 15. The resin film 25 has no theoretical limitations in length in the x and y directions. Thus it is possible to freely set the spring width a of the parallel springs 15, total width b of the link 16, and length l of the link 16. Further the pitch P' between the connection pads 19 of the circuit board 18 can be sufficiently larger than the pitch P between the wafer pads 54 on the chip.

Figure 21:
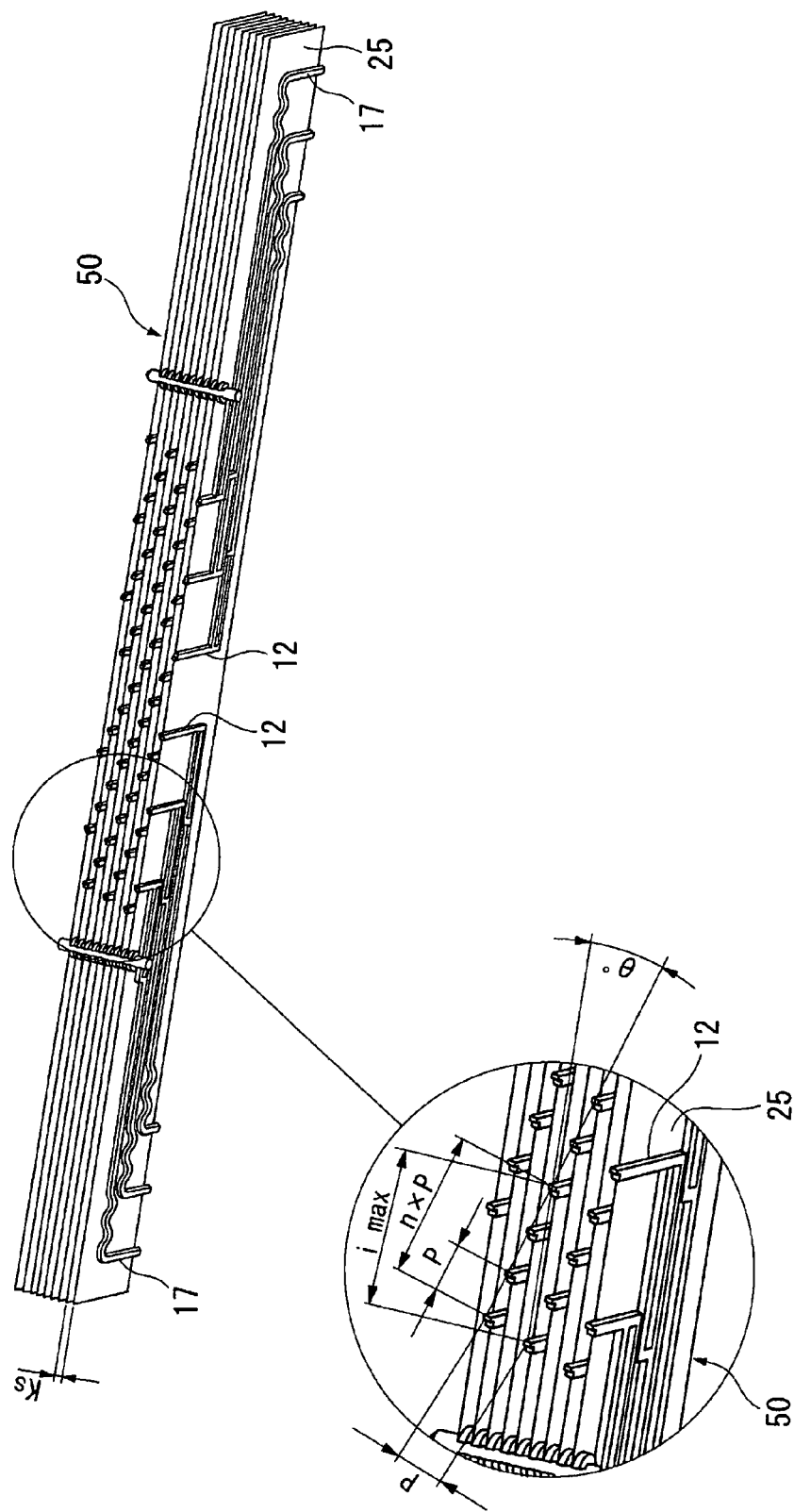
FIG. 21 is a perspective view showing the outer configuration of the probe assembly formed in the state in which the relative position between the pad arrangement and the pin laminated body arrangement is defined as shown in FIG. 20, in the sixth embodiment of the present invention.

FIG. 21 is a perspective view showing the outer configuration of the probe assembly formed in the state in which the relative position between the pad arrangement and the pin laminated body arrangement is defined as shown in FIG. 20. As is apparent from the figure, the terminals of the respective probes are arranged so as to correspond to the pads arranged in a grid fashion.

Figure 22:
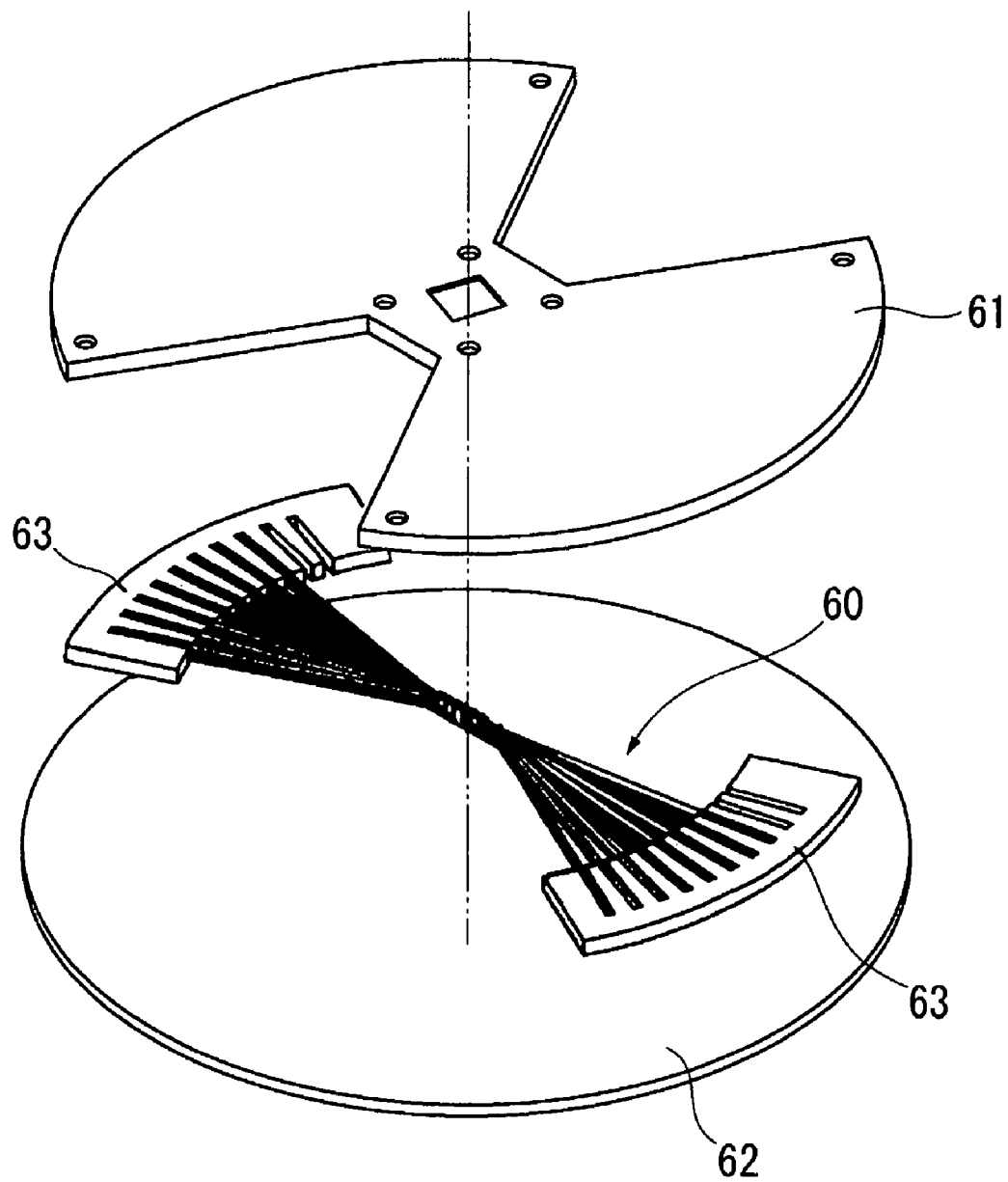
FIG. 22 is an exploded perspective view showing the configuration of a probe assembly retention mechanism for fixing the probe assembly according to the present invention to a PC board.

FIG. 22 and FIGS. 23A, 23B are views each showing the aspect of fixing a probe assembly to a PC board as a variation of the second embodiment. In these figures, FIG. 22 is an exploded perspective view showing the state in which a probe assembly 60 is fixed to a PC board 62 by means of a probe assembly retention mechanism 61. FIG. 23A is a top view showing the state in which the probe assembly 60 is fixed to the PC board 62 by means of the probe assembly retention mechanism 61. FIG. 23B is a side view showing the state in which the probe assembly 60 is fixed to the PC board 62 by means of the probe assembly retention mechanism 61. Each of the vertical probes 12 constituting the probe assembly 60 is configured that the terminal in the end portion thereof contacts the corresponding pad 13 of the chip 45 mounted in a substantially central portion of the PC board 62. Further in the probe assembly 60 in this example, each of the vertical probes 12 is configured that the base end (in which the terminal portion 17 is provided) is extended in a circular arc shape so that the distance between the terminals of the base ends is larger than the distance between the terminals of the end portions. With such a configuration, it is possible to simplify the wiring for taking out signals from the pads 13 arranged in high density on the chip 45, to the inspection circuit 18 of the circuit inspection apparatus or other equipment. As shown in FIG. 22, the base ends of the vertical probes 12 are extended in a circular arc shape and held by a guide member 63 in order to control their positions.

Figure 24:
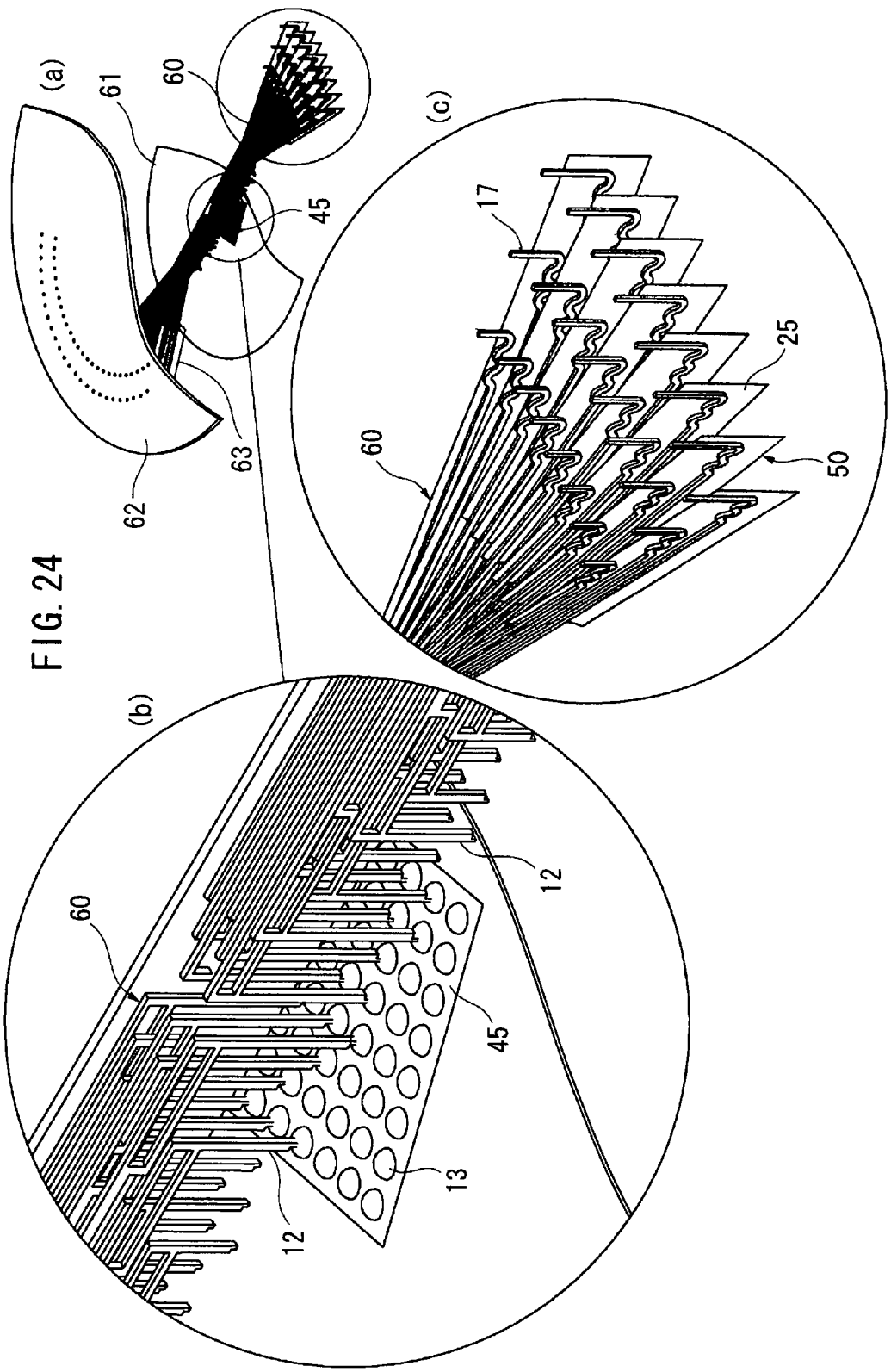

FIGS. 24A to 24C are views showing in further detail the contact portions between the terminals of the end portions of the vertical probes 12 and the corresponding pads 13 of the chip 45, as well as the configuration of the base ends of the vertical probes 12 extended in a circular arc shape, in the retention structure of the probe assembly 60 shown in FIG. 22 and FIGS. 23A, 23B. Here FIG. 24A is an exploded perspective view showing partially broken away of the arrangement relationship between the probe assembly 60 and the probe assembly retention mechanism 61 as well as the PC board 62. FIG. 24B is an enlarged perspective view showing the contact portions between the terminals of the end portions of the probes 12 and the corresponding pads 13 of the chip 45. FIG. 24C is an enlarged perspective view showing the base ends of the probes 12 extended in a circular arc shape. It is seen from the figures that the terminals in the end portions of the vertical probes 12 contact the pads 13 arranged in high density on the chip 45, while the base ends thereof are extended in a circular arc shape so as to maintain a predetermined distance therebetween. With such a configuration, it is possible to simplify the wiring for taking out signals from the pads 13 arranged in high density on the chip 45, to the inspection circuit of the circuit inspection apparatus or other equipment.

As describe above, the resin film with probe including the present approach can be applied to the circuit inspection apparatus (prober) adapted to the narrowing of pitch of semiconductor devices. For example, it has a function that can sufficiently follow the batch inspection of the wafer on which dozens to hundreds of semiconductor chips are formed at a diameter of 300 mm.

By commercializing a probe card of 120 μm pitch, which would be unlikely to be realized by the presently used probe card of the spring pin type, a new probe card of the probe pin tape lamination type will be provided to the market, and LSI manufacturers will be able to perform LSI inspection at wafer level immediately after completion of the earlier process. This will make it possible to provide the following important advantages:

1. Reduction in development time and development cost for development department by the function test available at wafer level; and
2. Improvement in productivity for production department, such as process rationalization, and increased yield rate by early detection of defects in LSIs.

The present invention has been described based on preferred embodiments shown in the drawings. However, it will be apparent to those skilled in the art that various changes and modifications can be added without departing from the sprit of the present invention. The present invention includes such variations.

What is claimed is:

1. A probe assembly for performing circuit inspection of semiconductor chips comprising:
    a conductive portion including a vertical probe made of metal foil attached to the surface of a resin film by applying etching process to the metal foil,
    a plurality of sheets of the resin film with the vertical probe are laminated, and end portions of the vertical probes are brought into contact with electrode pads of the semiconductor chips at a time,
    the conductive portion including the vertical probe forming a parallelogram link mechanism having a parallel spring structure,
    wherein a dummy portion is formed by leaving a portion, in addition to a portion as the conductive portion, without removing the metal foil when it is etched, and
    the dummy portion serving as a reinforcing member of the resin film.

2. The probe assembly according to claim 1, wherein the parallelogram link mechanism having the parallel spring structure is a cantilever structure that has the vertical probe on one end side and extends in a horizontal direction from the other end side as a support portion.

3. The probe assembly according to claim 1, wherein the parallel springs are the link mechanism which is bended and deformed.

4. The probe assembly according to claim 1, wherein an opening is provided in the resin film between the parallel springs.

5. The probe assembly according to claim 1, wherein an opening is not provided in the resin film between the parallel springs.

6. The probe assembly according to claim 5, wherein the vertical probes are arranged so as to be orthogonal to each other.

7. The probe assembly according to claim 6, wherein one or more electrically insulating resin materials and a fixing portion of the parallel springs are connected and fixed to each other.

8. A probe assembly according to claim 1, having a terminal portion for connecting to a vertical probe through a link mechanism and a conductive portion while contacting a connection pad of a circuit board.

9. The probe assembly according to claim 8, wherein the terminal portions are respectively formed in the resin films so as to be arranged at positions displaced by the same pitch when the resin films with probe are laminated.

10. The probe assembly according to claim 8, wherein a curved portion is provided in the conductive portion in the vicinity of the terminal portion.

11. The probe assembly according to claim 8, wherein a cut portion is provided in the vicinity of the link mechanism and of the terminal portion to form a cantilever structure.

12. The probe assembly according to claim 1, wherein an insulation adhesive is filled in the resin film surface between the conductive portion and the dummy portion.

13. A probe assembly according to claim 1, further comprising:
a plurality of vertical probes each having a conductive portion or conductive wiring of different length; and
support rods inserted into holes of the vertical probes;
wherein the vertical probes are arranged in one or two rows to allow electrical connection with electrodes roughly distributed over a circuit board.

14. A probe assembly for performing circuit inspection of semiconductor chips comprising:
a conductive portion including a vertical probe made of metal foil attached to the surface of a resin film by applying etching process to the metal foil,
a plurality of sheets of the resin film with the vertical probe are laminated, and end portions of the vertical probes are brought into contact with electrode pads of the semiconductor chips at a time,
the conductive portion including the vertical probe forming a parallelogram link mechanism having a parallel spring structure,
wherein the parallel springs are the link structure tilted at an angle θ relative to a horizontal direction,
wherein the amount of rubbing between the probe and the pad over a wafer can be changed by changing the angle θ.

15. A probe assembly for performing circuit inspection of semiconductor chips comprising:
a conductive portion including a vertical probe made of metal foil attached to the surface of a resin film by applying etching process to the metal foil,
a plurality of sheets of the resin film with the vertical probe are laminated, and end portions of the vertical probes are brought into contact with electrode pads of the semiconductor chips at a time,
the conductive portion including the vertical probe forming a parallelogram link mechanism having a parallel spring structure,
wherein a dummy portion is formed by leaving a portion, in addition to a portion as the conductive portion, without removing the metal foil when it is etched, and
the dummy portion serving as a reinforcing member of the resin film, and
wherein a positioning dummy portion exists in the vicinity of the vertical probe, and
a hole passing through the positioning dummy portion and the film, as well as one end of a coupling dummy portion are close to the vertical probe,
thereby facilitating the vertical probe, the coupling dummy portion, and the positioning dummy portion to be in the same plane.

16. The probe assembly according to claim 15, wherein a surface of the coupling dummy portion properly operates in the same plane as a surface of the vertical probe, and
force transmission is unlikely to occur in another contact assembly through the hole and a support rod.

17. A probe assembly for performing circuit inspection of semiconductor chips comprising:
a conductive portion including a vertical probe made of metal foil attached to the surface of a resin film by applying etching process to the metal foil,
a plurality of sheets of the resin film with the vertical probe are laminated, and end portions of the vertical probes are brought into contact with electrode pads of the semiconductor chips at a time,
the conductive portion including the vertical probe forming a parallelogram link mechanism having a parallel spring structure,
a parallel spring structure of the probe being shifted in x and z directions of x y z axes,
a plurality of the probes being arranged to form a probe group,
the above probe group, as well as second, third, fourth, and further probe groups sequentially shifted by the same amount in the x direction, forming an assembled unit of a resin-probe complex tape assembly,
the resin-probe complex tape assemblies being laminated at an appropriate interval,
thereby providing electrical connection input portions of desired grid arrangement,
wherein a dummy portion is formed by leaving a portion, in addition to a portion as the conductive portion, without removing the metal foil when it is etched, and
the dummy portion serving as a reinforcing member of the resin film.

18. The probe assembly according to claim 17, wherein the parallelogram link mechanism having the parallel spring structure is a cantilever structure that has the vertical probe on one end side and extends in a horizontal direction from the other end side as a support portion.

19. The probe assembly according to claim 17, wherein the parallel springs are the link mechanism which is bended and deformed.

20. The probe assembly according to claim 17, wherein an opening is provided in the resin film between the parallel springs.

21. The probe assembly according to claim 17, wherein an opening is not provided in the resin film between the parallel springs.

22. The probe assembly according to claim 17 having a terminal portion for connecting to the vertical probe through the link mechanism and the conductive portion while contacting a connection pad of a circuit board.

23. The probe assembly according to claim 22, wherein, when a plurality of sheets of the resin film with probe are laminated, the terminal portions are respectively formed in the resin films so as to be arranged at positions displaced by the same pitch between each of the resin films with probe.

24. The probe assembly according to claim 22, wherein a curved portion is provided in the conductive portion in the vicinity of the terminal portion.

25. The probe assembly according to claim 22, wherein a cut portion is provided in the vicinity of the link mechanism and of the terminal portion to form a cantilever structure.

26. The probe assembly according to claim 17, wherein an insulation adhesive is filled in a resin film surface between the conductive portion and the dummy portion.

27. The probe assembly according to claim 17, wherein the resin-probe complex tape assembly has the probe terminals arranged at a predetermined angle relative to the grid-like arrangement of the pads of the chip over the wafer.

28. The probe assembly according to claim 17, wherein the resin-probe complex tape assembly has the wiring portions symmetrically arranged so that the number of the wiring portions is substantially the same on the left and right sides.

29. The probe assembly according to claim 17, wherein an insulation adhesive is filled in a portion corresponding to the support portion of the parallel springs.

30. A probe assembly for performing circuit inspection of semiconductor chips comprising:
   a conductive portion including a vertical probe made of metal foil attached to the surface of a resin film by applying etching process to the metal foil,
   a plurality of sheets of the resin film with the vertical probe are laminated, and end portions of the vertical probes are brought into contact with electrode pads of the semiconductor chips at a time,
   the conductive portion including the vertical probe forming a parallelogram link mechanism having a parallel spring structure,
   a parallel spring structure of the probe being shifted in x and z directions of x y z axes,
   a plurality of the probes being arranged to form a probe group,
   the above probe group, as well as second, third, fourth, and further probe groups sequentially shifted by the same amount in the x direction, forming an assembled unit of a resin-probe complex tape assembly,
   the resin-probe complex tape assemblies being laminated at an appropriate interval,
   thereby providing electrical connection input portions of desired grid arrangement,
   wherein the probes constituting the probe assembly are configured such that the terminals of the respective end portions contact the corresponding pads of the chip mounted in a substantially central portion of a PC board, and such that the base portions thereof are extended in a circular arc shape to allow the distance between each of the terminals of the base portions to be larger than a distance between each of the terminals of the end portions.

31. The probe assembly according to claim 30, wherein the base portions of the probes are extended in a circular arc shape and held by a guide to control positions.

* * * * *